United States Patent
Iechi et al.

(10) Patent No.: US 7,002,176 B2
(45) Date of Patent: Feb. 21, 2006

(54) VERTICAL ORGANIC TRANSISTOR

(75) Inventors: Hiroyuki Iechi, Kanagawa (JP); Kazuhiro Kudoh, Chiba (JP)

(73) Assignees: Ricoh Company, Ltd., Tokyo (JP); Kazuhiro Kudoh, Chiba (JP)

( * ) Notice: Subject to any disclaimer, the term of this patent is extended or adjusted under 35 U.S.C. 154(b) by 78 days.

(21) Appl. No.: 10/441,792

(22) Filed: May 16, 2003

(65) Prior Publication Data

US 2004/0004215 A1 Jan. 8, 2004

(30) Foreign Application Priority Data

May 31, 2002 (JP) .............................. 2002-159138
Sep. 30, 2002 (JP) .............................. 2002-286815

(51) Int. Cl.
*H01L 29/72* (2006.01)

(52) U.S. Cl. ............................. 257/40; 257/60; 257/91

(58) Field of Classification Search ................. 257/91, 257/92, 94, 40

See application file for complete search history.

(56) References Cited

U.S. PATENT DOCUMENTS

| | | | |
|---|---|---|---|
| 5,061,974 A | 10/1991 | Onodera et al. | |
| 5,294,815 A | 3/1994 | Iechi | |
| 5,362,673 A | 11/1994 | Iechi | |
| 5,684,523 A | 11/1997 | Satoh et al. | |
| 5,900,336 A | 5/1999 | Kabata et al. | |
| 6,057,647 A * | 5/2000 | Kurosawa et al. | ........ 315/169.3 |
| 2002/0158262 A1 * | 10/2002 | Tsuchida | ..................... 257/91 |
| 2003/0015698 A1 * | 1/2003 | Baldo et al. | ................... 257/40 |

FOREIGN PATENT DOCUMENTS

JP 10270712 10/1998

OTHER PUBLICATIONS

K. Kudo et al. (2000) "Organic static induction transistor for display devices", Synthetic Metals, 111-112, pp. 11-14.
S. Kuniyoshi et al. (Jul. 2000) "Space-Charge Conduction in a Copper Phthalocyanine Static Induction Transistor", IEICE Trans. Electron., vol. E83-C, No. 7, pp. 1111-1113.
K. Ikegami et al. (2001) "Hybrid organic light emitting transistor", Technical Report of IEICE, EID2000-323, OME2000-172, pp. 1-5.
K. Kudo (2002) "Organic Thin-Film Transistors", AM-LCD 02, pp. 9-12.
K. Kudo et al. (1999) "Organic static induction transistor for color sensors", Synthetic Metals 102, pp. 900-903.
Kuzuhiro Kudo et al., "Schottky Gate Static Induction Transistor Using Copper Phthalocyanine Films", Thin Solid Films 331, 1998, pp. 51-54.
Dong Xing Wang et al., "Device Operation of Schottky Gate Type Induction Transistor Using Copper-Phthalocyanine Evaporated Films", vol. 118-A, No. 10, 1998, pp. 1166-1171.
K. Ikegami et al., "Fabrication of Hybrid Organic Electroluminescence Transistor", Technical Report of IEICE OME2000-20, pp. 47-51.

* cited by examiner

*Primary Examiner*—Edward Wojciechowicz
(74) *Attorney, Agent, or Firm*—Cooper & Dunham LLP

(57) ABSTRACT

A vertical organic transistor comprises a substrate, a first electrode positioned over the substrate, a first semiconductor layer formed over the first electrode, a second electrode formed on the first semiconductor layer and shaped into a prescribed pattern, a second semiconductor layer formed over the second electrode and the first semiconductor layer, and a third electrode formed over the second semiconductor layer. The first semiconductor layer and the second semiconductor layer are made of different semiconductor materials.

23 Claims, 17 Drawing Sheets

ITO／CuPc／Al

Al／α−NPD／Au

SIT STATIC CHARACTERISTIC
$V_{DS}-I_D$

VERTICAL ORGANIC TRANSISTOR

BACKGROUND OF THE INVENTION

1. Field of the Invention

The present invention relates to a vertical organic transistor used as a driving device of a spontaneous light-emitting organic electroluminescent (EL) display.

2. Description of the Related Art

In recent years, full-color displays using organic EL devices have been attracting a great deal of attention because of their potential advantages of (1) the light and compact structure, (2) the increased size of display screen, (3) the reduced fabrication cost, and (4) the capability of various types of light emission, as compared with light-emitting devices using inorganic materials. To realize such a full-color display using organic EL devices as commercially available products, various studies have been made.

Since an organic EL display using organic EL devices can be made thin with high intensity and high response rate, it is expected as a next-generation display device to replace currently wide-spread liquid crystal display devices. However, if an organic thin film transistor (TFT) fabricated with organic semiconductor materials is used as a driving device of an organic EL display, satisfactory driving operations cannot be achieved at the current stage because of high electric resistance and low charge mobility. Therefore, an organic TFT with an improved structure and characteristic is desired.

Organic transistors have been studied since the beginning of the 1980s, and the basic characteristics of organic semiconductor films made of low-molecular compounds and organic semiconductor films made of macromolecular compounds have been examined. However, because of the low electric charge mobility and high electric resistance of organic semiconductors, not so much attention was paid to practical applications in the earlier stage.

In recent years, studies on organic semiconductor films have been actively made to aim at practical use in cellular phones or large-sized display devices of the next generation, taking advantage of the lightness and the flexibility. For example, JPA 10-270712 discloses an organic TFT that achieves the electric charge mobility of 0.52 cm$^2$/V*sec by forming a pentacene film on a highly doped silicon substrate.

An organic semiconductor material includes (1) low-molecular compounds such as pentacene, and a metal complex of phthalocyanine, (2) a short-chain oligomer that contains 3 through 8 monomer units ($c_3$ through $c_8$) of thiophene, and (3) a long-chain polymer such as poly(thiophene), and poly(phenylenevinylene). The long-change polymer is known as a conductive polymer of a π-conjugated system, and electric charges can move along the molecules, the oligomer, and the polymer owing to the overlapped atomic orbits of multiple-bonded adjacent atoms. In addition, depending on the overlapped structure of the molecular orbits of adjacent molecules, electric charges can also move between molecules.

It is known that an organic thin film of a low-molecular compound or short-chain oligomer exhibits the highest electric charge mobility among organic materials. Such low-molecular compound or short-chain oligomer can be deposited as a regularly configured thin film by vacuum evaporation. The regular configuration within the thin film is assumed to produce overlapped atomic orbits, causing electric charges to move between adjacent molecules.

A film of long-chain polymer can be formed by a low-cost process, such as spin coating, or dipping coating because of the soluble characteristic, and is advantageous industrially. However, since the thin film of long-chain polymer has an irregular polymeric configuration, the electric charge mobility is degraded.

In short, there has been no organic semiconductor material having a definitely high mobility found so far.

Under these circumstances, a conventional (lateral type) field effect transistor (FET) may be arranged adjacent to the organic EL device in order to drive the organic EL device. However, merely introducing the conventional FET as a driving device cannot achieve satisfactory characteristics from the viewpoints of operation rate and electric power, because of poor mobility of electric charge.

Therefore, the inventors of the present invention have proposed a vertical organic static induction transistor (SIT) having an improved switching characteristic. See "Schottky Gate Static Induction Transistor Using Copper Phthalocyanine Films", Kudo, et al., Thin Solid Films 331(1998)51–54. The SIT employs a vertical FET structure as the switching device, which can achieve a large electric current and a relatively high operation rate even though the electric charge mobility is not so high.

The conventional field effect transistor is of a lateral type, which causes electric current to flow in the horizontal direction along the active layer. In contrast, in the vertical SIT, electric current flows in the vertical direction across the active layer. With the vertical structure, (a) the channel length of the transistor can be reduced to or below the thickness of the organic thin film, without requiring a photo-lithography technique, (b) the entire area of the, electrode formed on the surface of the organic layer can be efficiently used, and (c) adverse influence of the roughness of the channel interface effect can be reduced. For these reasons, a large electric current and a high operational rate can be expected even if an organic semiconductor material inferior in electric charge mobility and electric resistance is used as a semiconductor layer. The fabrication process of a composite-type organic light-emitting device, which is the combination of a vertical SIT and an organic EL device, is simple. In addition, since the FET does not prevent occupation of the display regions, the area efficiency can be improved.

FIG. 1 schematically illustrates a static induction transistor (SIT), which is used to explain the operation mechanism of the SIT. In general, the SIT has a semiconductor layer 104 sandwiched between the n+ type source electrode 101 and the n+ type drain electrode 102, with p+ type gate electrodes 103 inserted in the semiconductor layer 104. If a negative electric voltage is applied to the p+ type gate electrodes 103, depletion layers 105 (indicated by the dashed lines) extend from the p+ type gate electrodes 103 into the semiconductor layer 104. As long as the absolute value of the gate voltage is smaller than that of the pinch off voltage at which the depletion layers 105 contact with each other, the SIT is in the ON state. To turn off the SIT, a negative voltage is applied between the p+ type gate electrode 103 and the n+ type source electrode 101 to raise the electric potential level. The electric current $I_{SD}$ flowing between the n+ type source electrode 101 and the n+ type drain electrode 102 is determined by the electric voltage applied to the p+ type gate electrode 103 and the potential barrier produced by the drain voltage VD.

The SIT with this behavior is called a normally-on mode SIT. The normally-on mode SIT has such characteristics that (1) the operation speed is fast because there is no carrier injection from the gate, (2) a large quantity of electric current can be obtained without concentration of electric current, (3) the electric voltage can be controlled at a small driving power, and (4) an unsaturated I/V (current/voltage) characteristic is exhibited.

As an SIT using an organic semiconductor layer, a vertical TFT with a copper phthalocyanine (hereinafter referred to as "CuPc") layer sandwiched by the source and drain electrodes is known. (See "Device Operation of Schottky Gate Type Static induction Transistor Using Copper-Phthalocyanine Evaporated Films", Dong Xing Wang, et al., T.IEE Japan, Vol. 118-A, No. 10 (1998), 1166–1171) In this publication, gate electrodes are made as aluminum strips formed by vacuum evaporation, and positioned in the CuPc (organic material) layer.

A composite type organic light-emitting transistor, in which α-NPD and Alq$_3$ are arranged on CuPc, is also know (See "Fabrication of Hybrid Organic Electroluminescence Transistor", Ikegami, et al., Electronic Information Communication Association, OME200o-20, at 47–51). In this publication, α-NPD (i.e., bis[N-(1-naphthyl)-N-phenyl]benzidine, which is a low-molecular weight arylamine derivative) functions as a hole transport material, while Alq$_3$ (i.e., tris(8-quinolinolato) aluminum complex) functions as a luminous material. The gate electrodes are formed in the α-NPD layer.

In the above-described SIT, a Schottky barrier is created near the interface between the vacuum-evaporated organic molecular film of CuPc and the strips of the aluminum electrodes. The aluminum electrodes are formed by two-spot vacuum evaporation. With the two-spot vacuum evaporation, the aluminum evaporation sources are placed at two spots. By adjusting the distances between the evaporation sources, the evaporation mask, and the substrate, the strips of gate electrode can be formed at a uniform interval. In order to make the strips of gate electrodes function as the SIT gate, the slit width between two adjacent gate electrodes has to be set to the width of the depletion region of the Schottky barrier, which is less than several hundreds angstroms. Ordinary vacuum evaporation cannot realize this slit width. Therefore, by making use of the blur effect of the aluminum under the two-spot vacuum evaporation, strip-like semitransparent aluminum films and aluminum non-existing regions are alternately produced with the slit width corresponding to the depletion width.

With the two-spot vacuum evaporation, the positional relationship between the evaporation sources, the metal mask, and the substrate is geometrically set using the trigonometric ratio. To this end, it is difficult to determine the optimum position, and it is unsuitable for mass production.

SUMMARY OF THE INVENTION

Therefore, it is an object of the present invention to provide a vertical organic transistor suitable for mass production at reduced cost, while achieving improved operation speed and greater electric power.

To achieve the object, in one aspect of the invention, a vertical organic transistor comprises (a) a substrate, (b) a first electrode positioned over the substrate, (c) a first semiconductor layer formed over the first electrode, (d) a second electrode formed on the first semiconductor layer and shaped into a prescribed pattern, (e) a second semiconductor layer formed over the second electrode and the first semiconductor layer, the second semiconductor layer being made of a different material form that of the first semiconductor layer, and (f) a third electrode formed over the second semiconductor layer.

By using two different kinds of semiconductor layers between the source and the drain, a potential barrier is created at the interface between the two semiconductor layers. In addition, by arranging the gate electrode near the interface between the first and second semiconductor layers, a Schottky barrier is created near the gate. Consequently, leakage current can be effectively prevented.

Preferably, at least one of the first and second semiconductor layers are made of an organic semiconductor material. Using an organic material allows the device to be made light, while achieving a large-sized display with various types of light emission.

Preferably, one of the first and second semiconductor layers is made of an organic semiconductor material, while the other is made of an inorganic semiconductor material. By using an inorganic semiconductor material, together with an organic material, the operation speed can be further improved.

The first electrode and the first semiconductor layer make ohmic contact at the interface between them. The third electrode and the second semiconductor layer make ohmic contact at the interface between them. This arrangement allows the driving voltage to be reduced.

The second electrode and the first semiconductor layer make Schottky contact at the interface between them. The second electrode and the second semiconductor layer make Schottky contact at the interface between them. This arrangement allows the ON/OFF ratio of the organic transistor to be improved.

The first and second semiconductor layers are of a same conductivity type. Alternatively, the first and second semiconductor layers may be of opposite conductivity types.

If the first and second semiconductor layers are made of p-type organic semiconductor materials, both the potential barrier between the two p-type organic semiconductor layers and the Schottky barrier near the gate electrode take part in the operation mechanism of holes.

If the first and second organic semiconductor layers 3 and 5 are made of n-type organic semiconductor materials, both the potential barrier between the two p-type organic semiconductor layers and the Schottky barrier near the gate electrode take part in the operation mechanism of electrons. This arrangement allows the organic transistor to operate faster than the conventional static induction transistor (SIT) that operates under the hole-transport mechanism. Accordingly, a larger electric current can be produced, while achieving faster frequency response characteristic and increased electric power.

If the first and second semiconductor layers are made of organic semiconductor materials of opposite conductivity types, then both the PN barrier between the first and second semiconductor layers and the Schottky barrier near the gate electrode 4 take part in the operation mechanism by holes.

BRIEF DESCRIPTION OF THE DRAWINGS

Other objects, features, and advantages of the present invention will become more apparent from the following detailed description when read in conjunction with the accompanying drawings, in which.

DETAILED DESCRIPTION OF THE EMBODIMENTS

Figure 1:
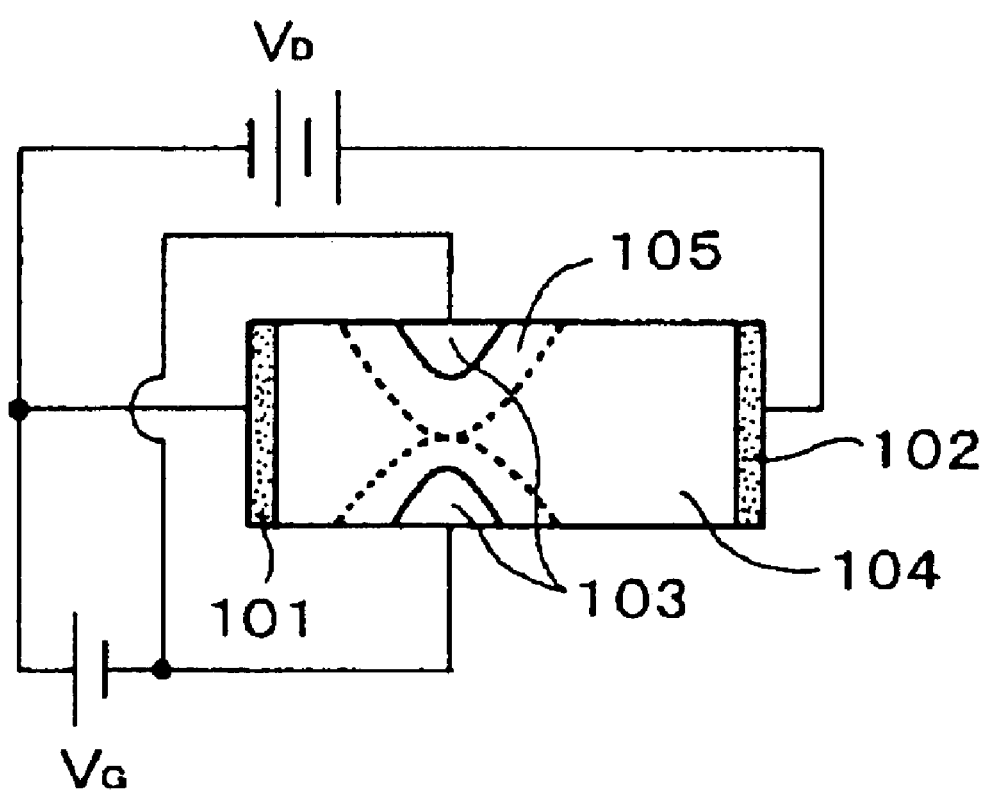
FIG. 1 schematically illustrates a static induction transistor (SIT) to explain the operation mechanism of the SIT.
Figure 2:
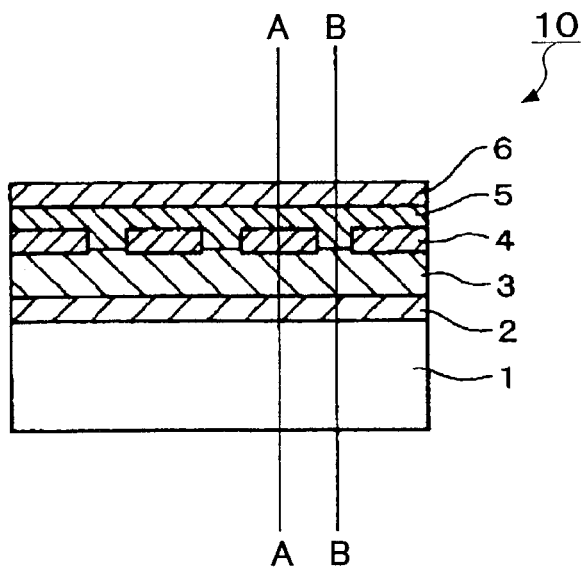
FIG. 2 is a cross-sectional view of a vertical organic transistor according to the first embodiment of the invention.

The details of the present invention will now be described with reference to the attached drawings. FIG. 2 illustrates a vertical organic transistor 10 according to the first embodiment of the invention. The vertical organic transistor 10 has a layered structure comprising a source electrode 2, a first organic semiconductor layer 3, a gate electrode 4, a second organic semiconductor layer 5, and a drain electrode 6, on the substrate 1. The first and second organic semiconductor layers 3 and 5 are made of different organic semiconductor materials so as to produce a potential barrier at the interface between the first and second organic semiconductor layers 3 and 5. The gate electrode 4 is positioned between the first and second organic semiconductor layers 3 and 5, and is shaped into, for example, a comb-like pattern, a meshed pattern, or a checker-board pattern. In the example shown in FIG. 2, the source electrode 2 is formed on the substrate 1; however, the drain electrode 6 may be formed on the substrate 1 as long as the layered structure is maintained.

The potential barrier is produced between the first and second organic semiconductor layers 3 and 5 due to the difference in potential energy of these two organic semiconductor materials. The first and second organic semiconductor materials may be of the same conductivity type, or alternatively, of different conductivity types. For example, both the first and second organic semiconductor materials may be of p-type, or n-type. Alternatively, a combination of p-type semiconductor material and n-type semiconductor material, p-type semiconductor material and I-type semiconductor material, and n-type and I-type semiconductor material may be employed.

Examples of the combination of first and second semiconductor materials include, but are not limited to, a combination of low-molecular materials, such as CuPc and a low-molecular weight arylamine derivative (referred to as "α-NPD", below), tris(8-quinolinolato) aluminum complex (referred to as "Alq$_3$", below) and tetracyano-p-quinodimethane (referred to as "TCNQ", below), α-NPD and Alq$_3$, CuPc and pentacene, pentacene and α-NPD, etc. A combination of polymer materials may also be used. For example, an n-type organic semiconductor material, such as poly(phenylenevinylene)(PPV), arylamines, poly(thienylenevinylene)(PTV), poly(thiophene), and spiro derivatives, and another n-type organic semiconductor material, such as pyridine, perylene derivatives, and phthalocyanine, etc., may be used as the first and second organic semiconductor material. Of course, any other combinations of organic semiconductor materials may be employed as long as the object of the present invention is achieved.

In the vertical organic transistor of the first embodiment, the combination of the first and second organic semiconductor layers 3 and 5 made of different types of organic semiconductor materials is layered between the source electrode 2 and the drain electrode 6 in the vertical direction. This structure has the following advantages.

(1) The channel length (that is, the electric current path length) of the organic transistor can be reduced up to the total thickness of the first and second organic semiconductor layers, and therefore, the operation speed can be improved with reduced resistance.

(2) The leakage current between the source and the drain can be reduced by effectively utilizing the Schottky contact and the barrier produced near the gate electrode due to difference in HOMO (highest occupied molecular orbital) level or LUMO (lowest unoccupied molecular orbital) level of the two different organic semiconductor materials.

(3) The vertical organic transistor can be mass-produced at reduced cost without requiring special effort, such as two-spot vacuum evaporation, in the fabrication process.

(4) Since the Schottky gate electrode is arranged near the interface between two types of organic semiconductor layers, the ON/OFF ratio of the transistor is increased.

Accordingly, an SIT with normally-off characteristic can be realized by appropriately selecting the materials of the first and second organic semiconductor layers.

(5) The entirety of each electrode formed over the surface of the organic semiconductor layer can be efficiently used to produce a large electric current flow.

Because the first and second organic semiconductor layers 3 and 5 are sandwiched between the source electrode 2 and the drain electrode 5, the gap between the source and the drain is narrow. Therefore, the pinch off point generated in the semiconductor layer of the conventional FET is shifted to the vicinity of the source electrode 2 of the organic transistor 10. Consequently, the effective channel length approaches zero, and the channel cannot control the electric current. This means that the rectification effect near the source electrode 2 becomes dominant.

Figure 3:
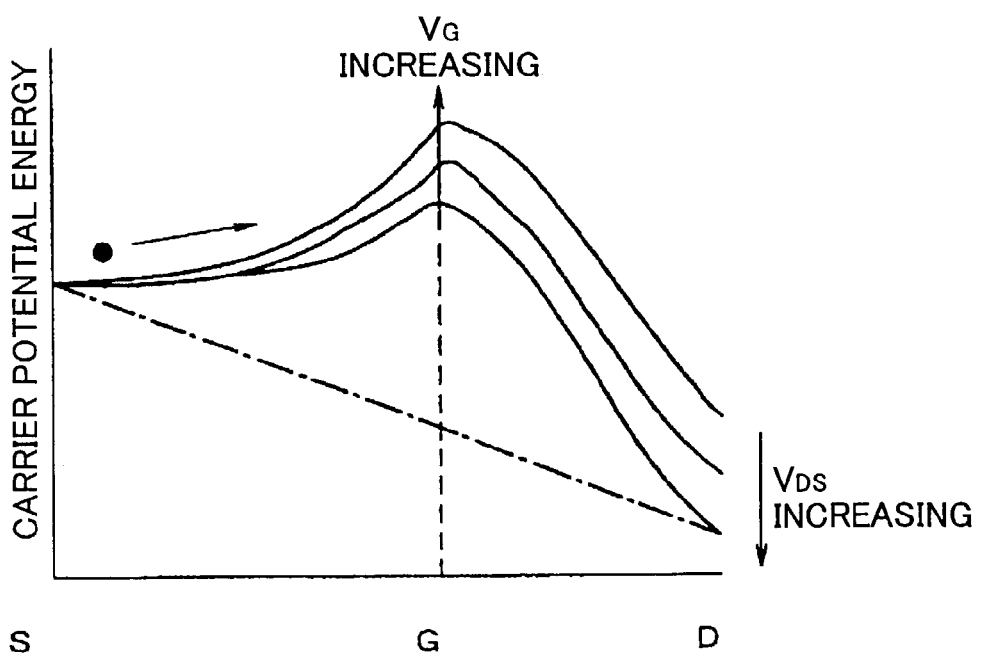
FIG. 3 is a graph showing the profile of the carrier potential energy between the source electrode (S) and the drain electrode (D) of the vertical organic transistor of the first embodiment.

FIG. 3 illustrates the profile of the carrier potential energy distribution between the source electrode 2 and the drain electrode 6. If a bias is applied between the source electrode 2 and the drain electrode 6, the carrier potential energy is sloped linearly, as indicated by the dashed line. However, the potential position of the gate electrode 4 is unchanged, and therefore, the potential distribution profile illustrated in FIG. 3 is obtained.

As a gate voltage $V_G$ is applied, the peak rises. As a drain voltage is applied, the skirt of the mountain lowers. Bias is applied to the gate electrode 4 so that the depletion layer expands, namely, so that the potential barrier rises, and therefore, a large potential barrier is produced with respect to the carriers along the A—A line shown in FIG. 2. On the other hand, although the carrier potential energy along the B—B line is slightly raised due to the pull-up effect by the gate electrode 4, the carrier potential energy is basically small as compared with that along the A—A line, and therefore, the overall potential barrier with respect to the carrier is lowered. Consequently, carriers flow to the drain electrode 6 passing through the slit of the gate electrode 4. If the carrier potential at the source electrode 2 is the reference, the pinch off point is raised by a quantity of diffusion potential $\phi D$ generated at the interface with the organic semiconductor layer. In addition, the potential energy level of the gate electrode 4 becomes higher than the effective gate potential level by the quantity of gate voltage $V_G$. For these reasons, the above-described advantages (1) through (3) can be achieved because the total potential barrier can be raised by setting the junction near the gate electrode 4.

The organic semiconductor materials used in the vertical organic transistor 10 are selected from the materials listed below, so that the first and second organic semiconductor layers 3 and 5 are made of different organic semiconductor materials to generate a potential barrier at the interface between the organic semiconductor layers 3 and 5.

(1) At least one kind of linearly condensed polycyclic aromatic compound (acene compound) selected from the group consisting of naphthalene, anthracene, tetracene, pentacene, hexacene, and derivatives thereof;

(2) at least one kind of pigment selected from the group consisting of copper-phthalocyanine(CuPc)-based compounds, azo compounds, perylene-based compounds, and derivatives thereof;

(3) at least one kind of low-molecular compound selected from the group consisting of hydrazone compounds, triphenylmethane-based compounds, diphenylmethane-based compounds, stilbene-based compounds, arylvinyl compounds, pyrazoline-based compounds, triphenylamine derivatives (TPD), triarylamine compounds, low-molecular weight arylamine derivatives ($\alpha$-NPD), and derivatives thereof; and (4) at least one kind of polymer compound selected from the group consisting of poly(N-vinylcarbazole), halogenated poly(N-vinylcarbazole), poly(vinylpyrene) poly(vinylanthracene), pyrene-folmaldehyde resin, ethylcarbazole-folmaldehyde resin, and modifications thereof.

Other than these materials, fluorenon-based compounds, diphenoquinone-based compounds, benzoquinone-based compounds, anthraquinone-based compounds, indenone-based compounds, polythiophene-based compounds, and polyphenylenvinylene-based compounds may also be used.

By using these materials, the overall structure of the organic transistor can be reduced, and the fabrication cost can also be reduced.

A layer of any one of these organic semiconductor materials can be formed by vacuum evaporation, chemical vapor deposition, spin coating, printing, coating/baking, electro-polymerization, molecular beam epitaxy, self-assembling from solution, and any combinations thereof. Any desirable simple method, such as vacuum evaporation or coating, can be selected to form the organic semiconductor layers, and the fabrication cost of the organic transistor can be effectively reduced.

Both of the first and second organic semiconductor layers 3 and 5 may be made of p-type organic semiconductor materials, or alternatively, both of them may be made of n-type organic semiconductor materials. The source electrode 2 and the first organic semiconductor layer 3 make ohmic contact with each other at the interface thereof. Similarly, the drain electrode 6 and the second organic semiconductor layer 5 make ohmic contact with each other at the interface thereof. The gate electrode 4 makes Schottky contact with the first organic semiconductor layer 3 at the interface thereof. Similarly, the gate electrode 4 makes Schottky contact with the second organic semiconductor layer 5 at the interface thereof.

With the first and second organic semiconductor layers 3 and 5 made of p-type organic semiconductor materials, the potential barrier between the two p-type organic semiconductor layers and the Schottky barrier near the gate electrode take part in the SIT operation mechanism of holes. Therefore, (1) the operation speed can be increased substantially eliminating the carrier injection from the gate electrode 4, (2) break-down voltage can be increased (and therefore, a large electric current can be produced), substantially eliminating concentration of electric current, (3) the ratio between the on-current and off-current can be increased, (4) a normally-off type vertical organic transistor can be realized, and (5) the device structure is suitable for mass production, which leads to the reduced cost.

If the first and second organic semiconductor layers 3 and 5 are made of n-type organic semiconductor materials, both the potential barrier between the two p-type organic semiconductor layers and the Schottky barrier near the gate electrode take part in the SIT operation mechanism of electrons. This arrangement allows the SIT to operate faster than the conventional SIT that operates under the hole-transport mechanism. Accordingly, a larger electric current can be produced, while achieving faster frequency response characteristic and increased electric power.

The first and second organic semiconductor layers 3 and 5 may be made of organic semiconductor materials of different conductivity types. Namely, the first organic semiconductor layer 3 is made of p-type organic semiconductor material, and the second organic semiconductor layer 5 is made of n-type organic semiconductor material. On the contrary, the first organic semiconductor layer 3 may be made of n-type organic semiconductor material, and the second organic semiconductor layer 5 may be made of p-type organic semiconductor material. The source electrode 2 and the first organic semiconductor layer 3 make ohmic contact with each other at the interface thereof. The drain electrode 6 and the second organic semiconductor layer 5 make ohmic contact with each other at the interface thereof. The gate electrode 4 makes Schottky contact with the first organic semiconductor layer 3 and the second organic semiconductor layer 5 at the respective interfaces.

If one of the first and second organic semiconductor layers 3 and 5 is made of a p-type organic semiconductor material, with the other made of an n-type organic semiconductor material, then both the PN barrier between the first and second organic semiconductor layers 3 and 5 and the Schottky barrier near the gate electrode 4 take part in the SIT operation mechanism by holes.

Therefore, (1) the operation speed can be increased substantially eliminating the carrier injection from the gate electrode 4, (2) break-down voltage can be increased (and a large electric current can be produced) because concentration of electric current is substantially eliminated, (3) the ratio between the on-current and off-current can be increased, (4) a normally-off type vertical organic transistor can be realized, and (5) the device structure is suitable for mass production, which leads to the reduced cost.

With the structure having the first and second organic semiconductor layer 3 and 5 made of two different p-type organic semiconductor materials so as to produce a potential barrier at the interface thereof, electric current flows from the source electrode 2 to the drain electrode 6 by controlling the bias applied to the gate electrode 4, and therefore, by controlling the height of the potential barrier with respect to the hole.

Lowering the carrier injection barrier between the electrode and the organic semiconductor layer leads to reduction of voltage applied to the electrode. Raising the carrier injection barrier between the electrode and the organic semiconductor layer leads to raising a voltage applied to the electrode. Some metals or some organic materials having metal-like properties do not always exhibit the rectification characteristic. Concerning metal and p-type organic semiconductor material, if the work function $\phi m$ of the electrode material is greater than the work function $\phi s$ of p-type organic semiconductor material ($\phi m > \phi s$) with a small difference between these work functions, then the electrode makes contact with the p-type organic semiconductor material in a similar manner to ohmic contact. With respect to electrons, if the electron affinity $\chi m$ of the electrode is greater than that of the organic semiconductor material ($\chi m = \phi m > \chi s$) with a small difference between them, the electrode and the p-type organic semiconductor material make contact in a similar manner to ohmic contact.

With respect to holes, achieving ohmic contact is not so difficult if a metal or a metal-like material having the work function $\phi m$ slightly greater than the work function of the electrode or the HOMO (Highest Occupied Molecular Orbital) level is selected. With respect to electrons, achieving ohmic contact is not so difficult if a metal or a metal-like material having the electron affinity $\chi m$ (which equal $\phi m$) slightly greater than the electron affinity of the electrode and the LUMO (Lowest Unoccupied Molecular Orbital) level is selected. In this manner, the driving voltage can be reduced.

If the work function of the electrode material satisfies $\phi m < \phi s$ with a large difference between them, Schottky contact is achieved. For the holes, an energy level of inside the organic semiconductor material is lower than the surface by quantity of $\phi s - \phi m$, and an energy barrier is produced inside the organic semiconductor material. The energy barrier on the metal side is expressed as $$\phi sb = (\chi s + [(HOMO\ \text{level}) - (LUMO\ \text{level})]) - \chi m,$$

and the diffusion potential becomes $\phi s - \phi m$.

Figure 5:
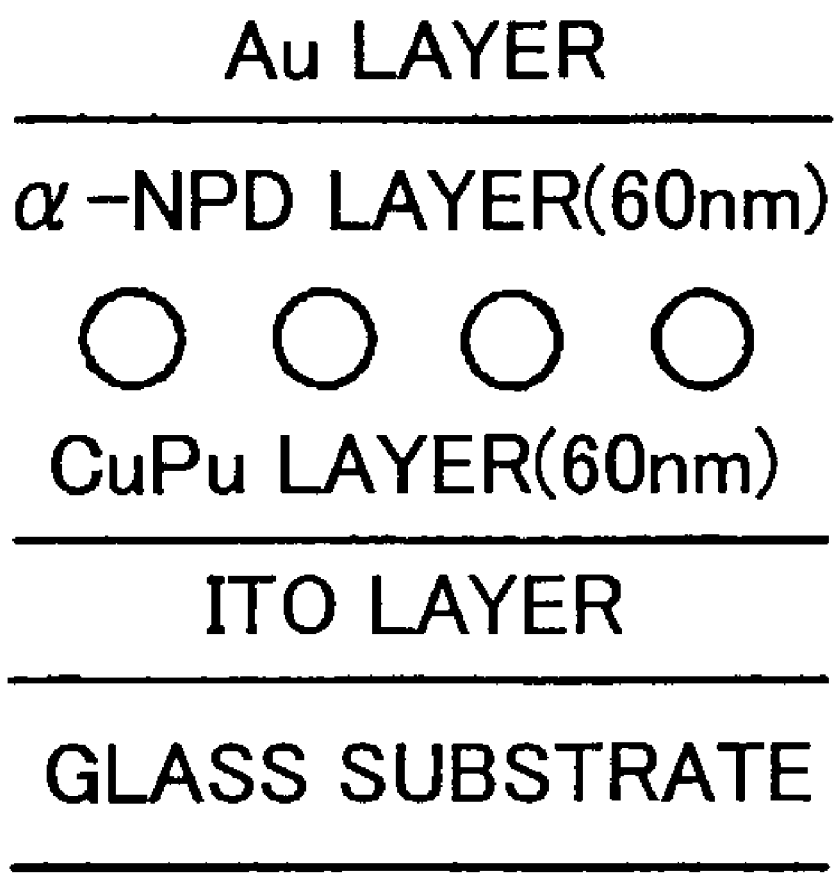
FIG. 5 is a schematic cross-sectional view of the vertical organic transistor of Example 1 fabricated by the fabrication process of the first embodiment.

It is known that CuPc exhibits characteristics of p-type semiconductor. The HOMO level of CuPc is 5.2 eV, and its LUMO level is 3.2 eV. It is also known that α-NPD exhibits characteristics of p-type semiconductor. The HOMO level and the LUMO level of α-NPD are 5.7 eV and 2.6 eV, respectively. If these two organic semiconductor materials are layered, as illustrated in FIG. 5, the barrier with respect to holes at the interface is 0.5 eV, which corresponds to the difference between the HOMO levels of these two materials. By making use of the barrier created at the interface between these two p-type organic semiconductor layers and the Schottky gate barrier, a vertical organic transistor having a novel SIT operation mechanism can be realized.

Figure 9A:
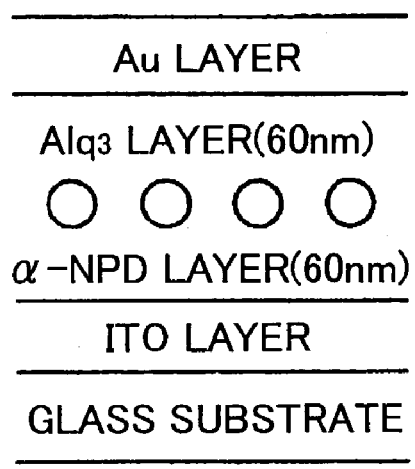
FIG. 9A is a schematic cross-sectional view of the vertical organic transistor of Example 3 fabricated by the fabrication process of the first embodiment.
Figure 9B:
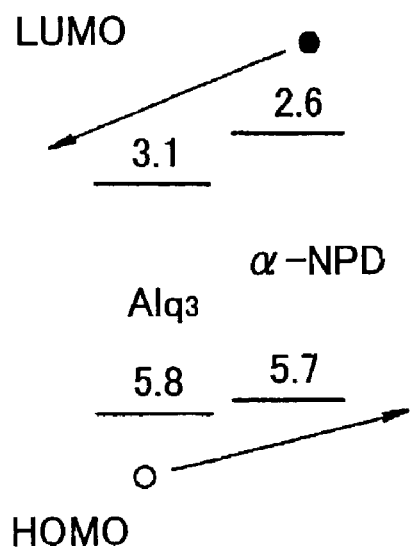
FIG. 9B illustrates the energy levels of the respective layers of the vertical organic transistor of Example 3.

Alq$_3$ is known as the n-type organic semiconductor material, having the HOMO level of 5.8 eV and the LUMO level of 3.1 eV. This n-type organic semiconductor material, Alq$_3$, can be used together with the above-described α-NPD, which is p-type organic semiconductor, as illustrated in FIG. 9A. Since the HOMO level of α-NPD is slightly lower than that of Alq$_3$, the layered structure of these two materials is very effective for hole injection, as illustrated in FIG. 9B. This structure is also efficient for electron injection because of the slight difference between the LUMO levels of these two materials. In FIG. 9B, the white circle denotes a hole, and the black circle denotes an electron. Accordingly, by making use of the barrier created at the interface between Alq$_3$ layer and α-NPD layer, as well as the Schottky gate barrier, a vertical organic transistor having a novel SIT operation mechanism can be realized.

The gate electrode 4, the source electrode 2, and the drain electrode 6 are made of at least one of chromium (Cr), tantalum (Ta), titanium (Ti), copper (Cu), aluminum (Al), molybdenum (Mo), tungsten (W), nickel (Ni), gold (Au), palladium (Pd), platinum (Pt), silver (Ag), tin (Sn), oxides thereof, indium tin oxide (ITO), electrically conductive poly(aniline), electrically conductive poly(pyrrole), electrically conductive poly(thiazyl) and electrically conductive polymer. By selecting the electrode material from among these materials, the contact resistance can be reduced, and the electric characteristics can be improved. The gate electrode 4, the source electrode 2 and the drain electrode 6 can be formed by vacuum evaporation, spattering, chemical vapor deposition, electrodeposition, electroless plating, spin coating, printing, coating, and other suitable processes.

The substrate may be located under the source electrode, or alternatively, under the drain electrode. The substrate may be made of glass, plastic, quartz, undoped silicon, highly-doped silicon, and other suitable material. If a plastic substrate is used, polycarbonate, miler resin, and polyimide may be used.

In the first embodiment, the gate electrode 4 is made of aluminum (Al) film with a thickness of 100 nm or smaller, and preferably, a thickness ranging from 40 nm to 60 nm. The source electrode 2 and the drain electrode 6 have a thickness of 100 nm to 500 nm.

FIG. 4A through FIG. 4E illustrate an example of the fabrication process of the vertical organic transistor according to the first embodiment of the invention.

Figure 4A:
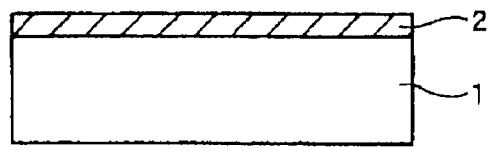
FIG. 4A through FIG. 4E illustrate a fabrication process of the vertical organic transistor according to the first embodiment.

First, as illustrated in FIG. 4A, a transparent electrode material film, such as an ITO film, is formed over the transparent substrate 1 to form the source electrode 2.

Figure 4B:
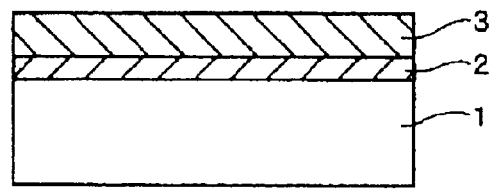

Then, as illustrated in FIG. 4B, an organic semiconductor material layer is formed over the source electrode 2 to form a first organic semiconductor layer 3.

Figure 4C:
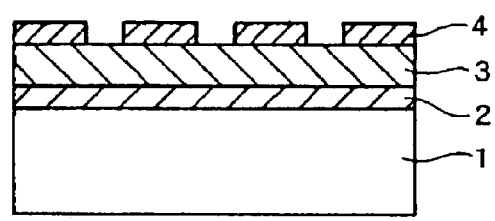

Then, as illustrated in FIG. 4C, an electrode material layer is formed into a comb-like or a meshed pattern to form the gate electrode 4 over the first organic semiconductor layer 3.

Figure 4D:
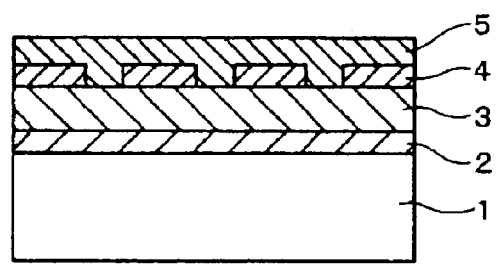

Then, as illustrated in FIG. 4D, another kind of organic semiconductor material layer is formed over the entire surface, whereby the second organic semiconductor layer 5 is formed over the gate electrode 2 and the first organic semiconductor layer 3. In this state, the gate electrode 2 is positioned at the interface between the first and second organic semiconductor layers 3 and 5.

Figure 4E:
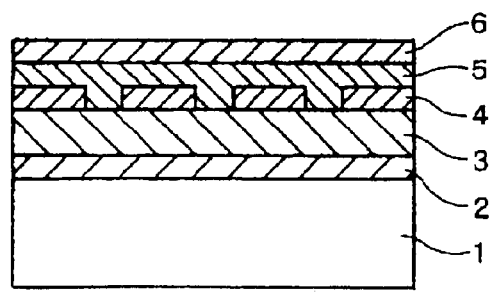

Then, as illustrated in FIG. 4E, an electrode material layer is formed over the second organic semiconductor layer 5 so as to form a drain electrode 6.

Next, actual examples of vertical organic transistor will be explained in more detail.

EXAMPLE 1

(a) An ITO transparent electrode layer comprised of Indium oxide and Tin oxide is formed by spattering over the transparent glass substrate (e.g., non-alkali glass 1737F manufactured by Corning Inc.) with a thickness of 0.7 mm, to form the source electrode 2 with a thickness of 110 nm.

(b) Then, CuPc, which is a p-type organic semiconductor material, is vacuum-evaporated onto the source electrode 2 at 400° C. and $3 \times 10^{-6}$ torr to form the first organic semiconductor (CuPc) layer 3 with a thickness of 60 nm.

(c) Then, aluminum strips is formed onto the CuPc layer 3 by vacuum evaporation using a nickel mask having a striped pattern, under resistance heating at $1 \times 10^{-6}$ torr, thereby forming the gate electrode 4 with a thickness of 40 nm.

(d) Then, α-NPD, which is a p-type organic semiconductor material, is vacuum-evaporated over the gate electrode 4 and the CuPc layer 3 at 200° C. and $5 \times 10^{-6}$ torr, to form the second organic semiconductor (α-NPD) layer 5 with a thickness of 60 nm.

(e) Finally, a gold (Au) layer is formed over the α-NPD layer 5 by vacuum evaporation under resistnace heating at $1 \times 10^{-6}$ torr to form the drain electrode 6 with a thickness of 100 nm.

Figure 6:
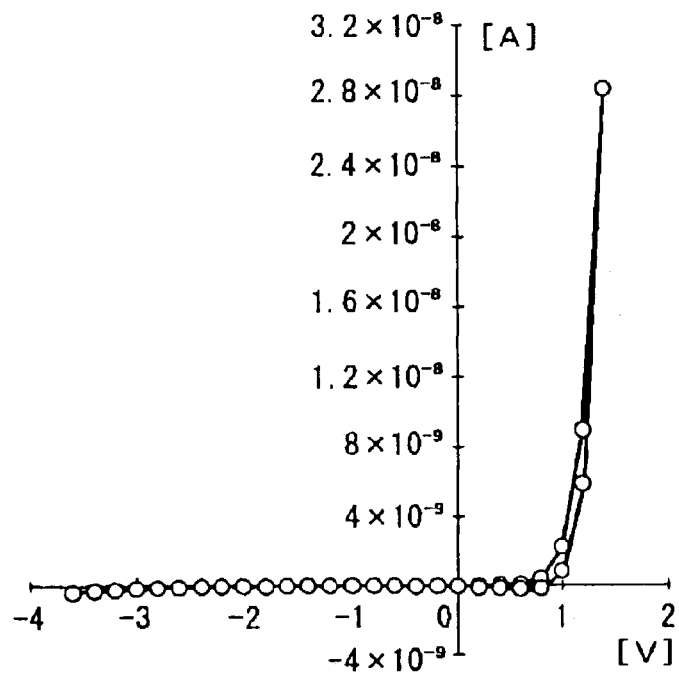
FIG. 6 illustrates the I-V characteristic between the source electrode and the gate electrode of the vertical organic transistor according to the first embodiment of the invention.
Figure 7:
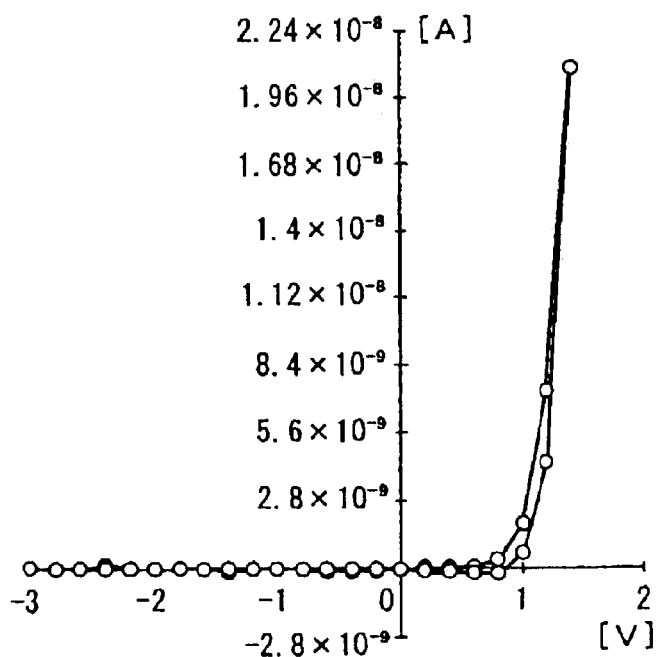
FIG. 7 illustrates the I-V characteristic between the gate electrode and the drain electrode of the vertical organic transistor according to the first embodiment of the invention.

The vertical organic transistor fabricated in the above-described process is schematically illustrated in FIG. 5. The circles illustrated between the CuPc layer and α-NPD layer are aluminum (Al) gate electrodes. With this vertical organic transistor, the I-V characteristic between the source electrode (ITO electrode) and the aluminum gate electrode was measured. The measurement result is shown in FIG. 6. From the graph of FIG. 6, it is confirmed that the Schottky contact is produced at the interface between the gate electrode and the CuPc layer. Similarly, the I-V characteristic between the aluminum gate electrode and the Au drain electrode was measured, the measurement result of which is illustrated in FIG. 7. It is confirmed that the Schottky contact is produced at the interface between the gate electrode and the α-NPD layer.

In addition, the I-V characteristic between the source and the drain was measured with the gate electrode kept floating, and it was confirmed from the measurement result that ohmic contact is produced between the source electrode and the CuPc layer, and between the drain electrode and α-NPD layer.

Figure 8:
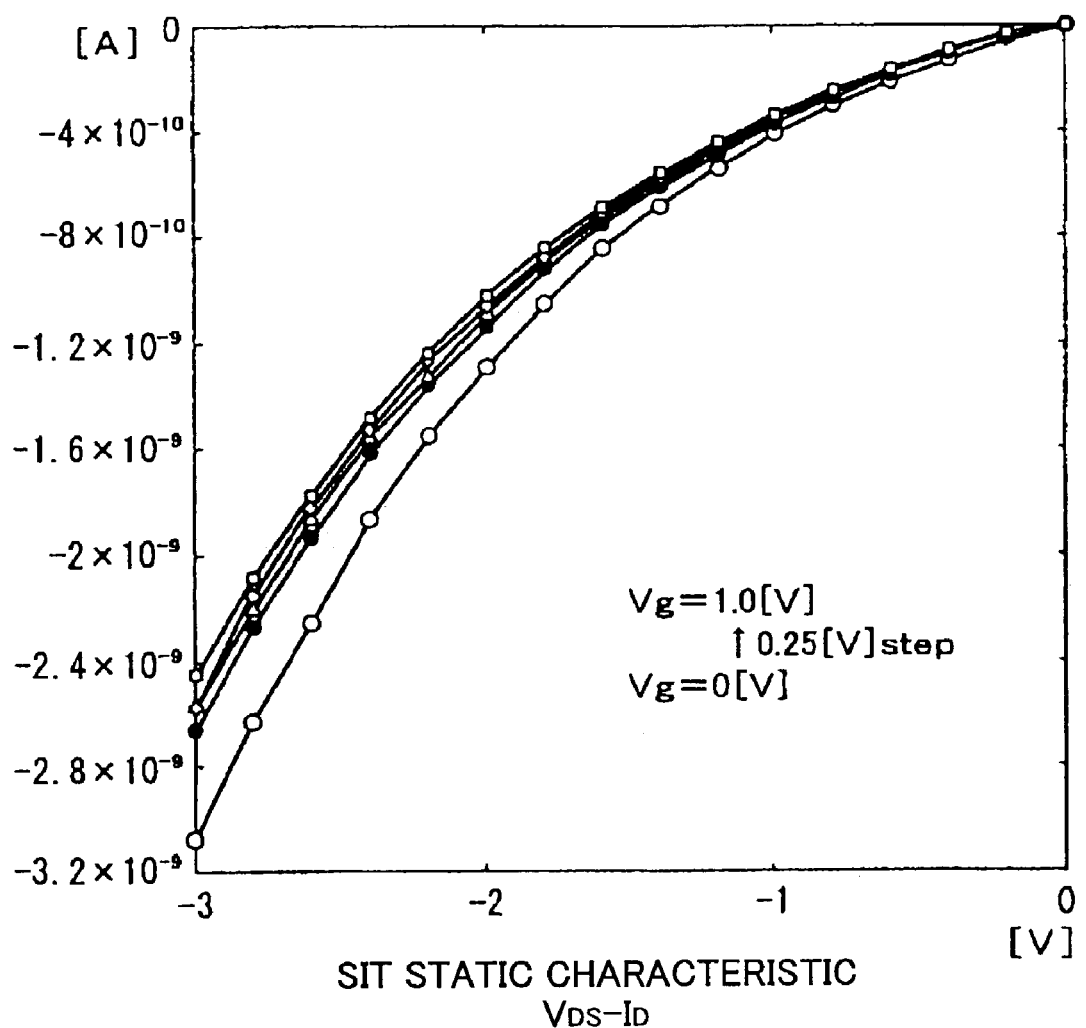
FIG. 8 illustrates the static characteristic of the vertical organic transistor according to the first embodiment.

Furthermore, the static characteristic of the vertical organic transistor was measured, the measurement result of which is illustrated in FIG. 8. Form the graph shown in FIG. 8, the vertical organic transistor of the example 1 can operate as a normally-off transistor. Although not shown in drawing, the cut-off frequency of this vertical organic transistor is in the range from 30 KHz to 60 KHz.

EXAMPLE 2

Both the first and second organic semiconductor layers 3 and 5 are made of n-type organic semiconductor material. To be more precise, the first organic semiconductor layer 3 is made of Alq$_3$ (tris(8-hydroxyquinoline)aluminum), and the second organic semiconductor layer 5 is made of TCNQ (tetracyanoquinodimethane). Other fabrication steps are the same as those in Example 1.

EXAMPLE 3

In Example 3, the first and second organic semiconductor layers 3 and 5 are made of a p-type organic semiconductor material and an n-type organic semiconductor material, respectively.

(a) An ITO transparent electrode layer comprised of Indium oxide and Tin oxide is formed by spattering over the transparent glass substrate (e.g., non-alkali glass 1737F manufactured by Corning Inc.) with a thickness of 0.7 mm, to form the source electrode 2 with a thickness of 110 nm.

(b) Then, α-NPD, which is a p-type organic semiconductor material, is vacuum-evaporated onto the source electrode 2 at 200° and $5 \times 10^{-6}$ torr to form the first organic semiconductor layer 3 with a thickness of 60 nm.

(c) Then, aluminum strips is formed onto the α-NPD layer 3 by vacuum evaporation using a nickel mask having a striped pattern, under resistance heating at $1 \times 10^{-6}$ torr, thereby forming the gate electrode 4 with a thickness of 100 nm.

(d) Then, Alq$_3$, which is an n-type organic semiconductor material, is vacuum-evaporated over the gate electrode 4 and the α-NPD layer 3 at 220° and $1.6 \times 10^{-6}$ torr, to form the second organic semiconductor layer 5 with a thickness of 60 nm.

(e) Finally, a gold (Au) layer is formed over the Alq$_3$ layer 5 by vacuum evaporation under resistance heating at $1 \times 10^{-6}$ torr to form the drain electrode 6 with a thickness of 100 nm.

The vertical organic transistor fabricated in the above-described process is schematically illustrated in FIG. 9A. The circles illustrated between the α-NPD layer and Alq$_3$ layer are aluminum (Al) gate electrodes. The energy levels of the α-NPD layer and the Alq$_3$ layer are illustrated in FIG. 9B.

Figure 10:
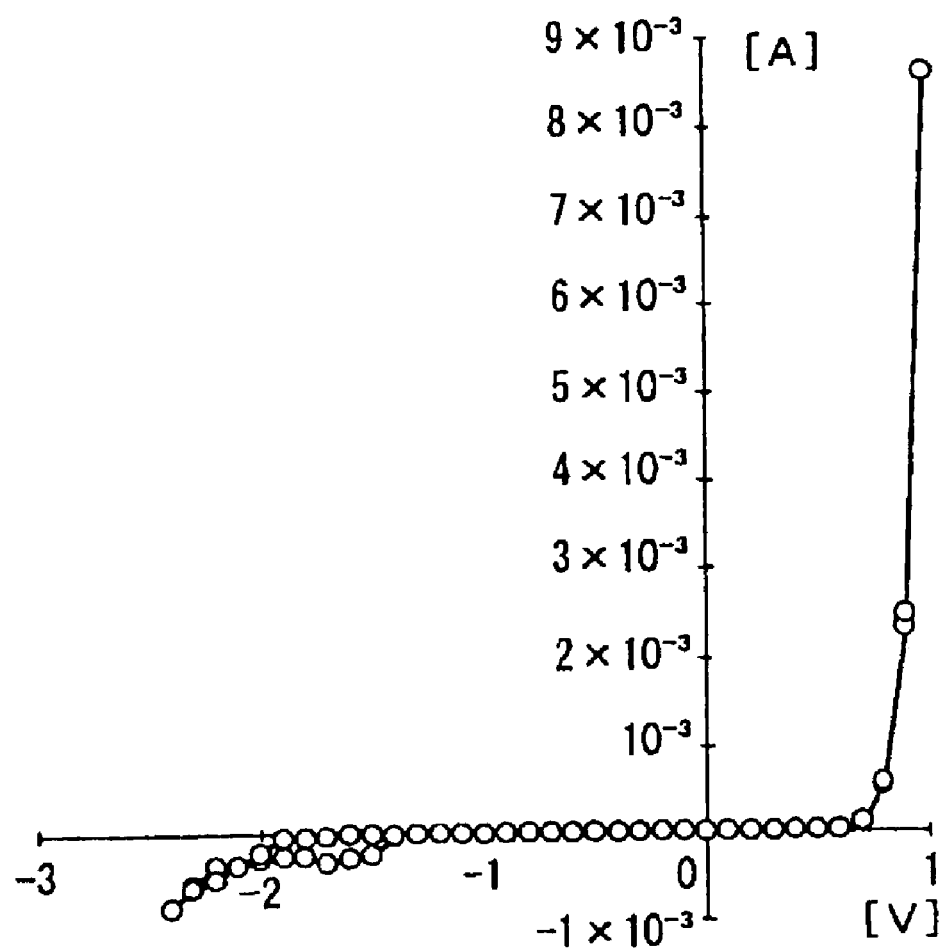
FIG. 10 illustrates the I-V characteristic between the source electrode and the gate electrode of the vertical organic transistor of Example 3 of the first embodiment.
Figure 11:
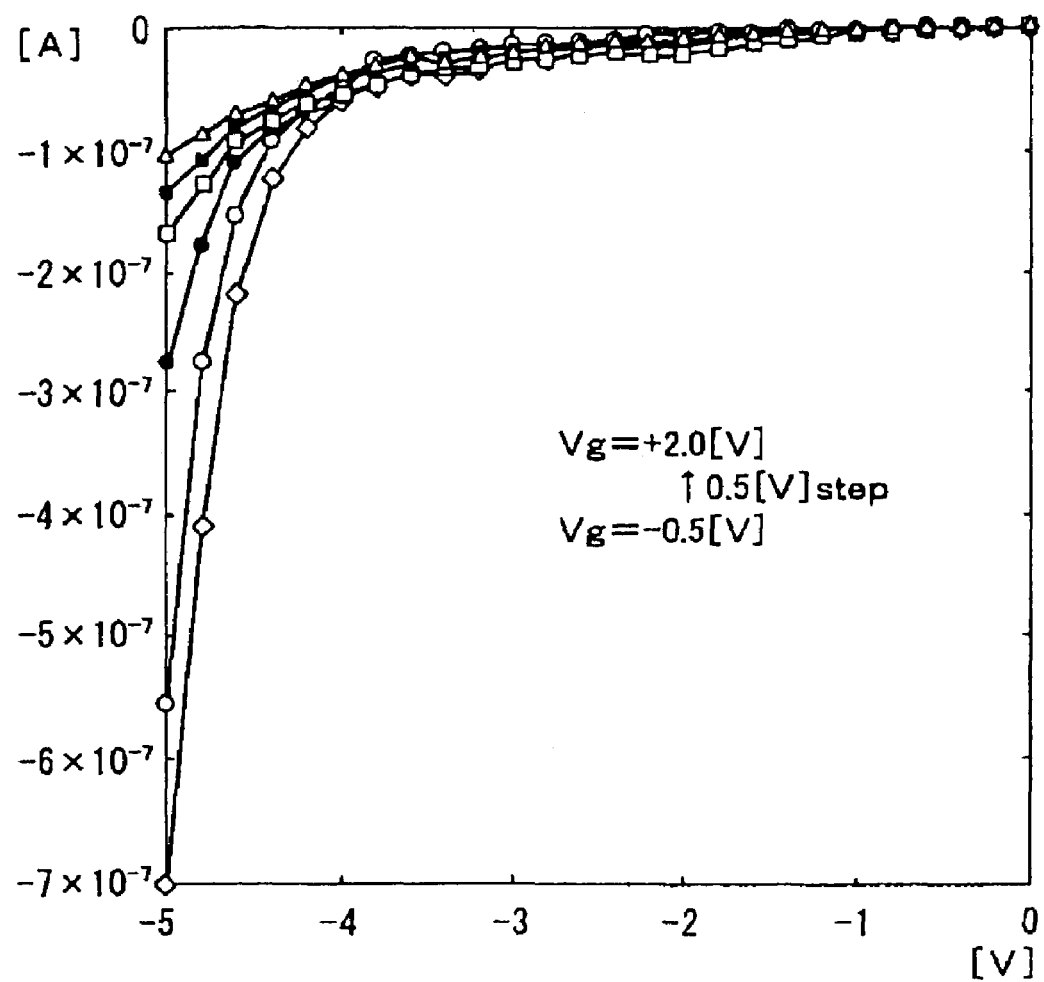
FIG. 11 illustrates the static characteristic of the vertical organic transistor of Example 3 of the first embodiment.

With this vertical organic transistor, the I-V characteristic between the source electrode (ITO electrode) and the aluminum gate electrode was measured. The measurement result is shown in FIG. 10. From the graph of FIG. 10, it is confirmed that the Schottky contact is produced at the interface between the gate electrode and the α-NPD layer. The static characteristic of the vertical organic transistor was also measured, the measurement result of which is illustrated in FIG. 11. The cut-off frequency (not shown) was 30 KHz to 60 KHz.

With the vertical organic transistor according to the first embodiment, (1) the channel length of the transistor can be reduced up to the total thickness of the layered organic semiconductors, and therefore, fast operation speed can be achieved; (2) effective use of the potential barrier due to the Schottky contact near the gate electrode and the potential barrier due to difference in HOMO levels or LUMO levels of two different types of organic semiconductor materials can reduce the leakage current between the source and the drain; (3) the vertical organic transistor can be mass-produced at reduced cost, without using the two-spot evaporation technique; (4) since the Schottky gate electrodes are located at or near the interface between the two different organic semiconductor layers, the ON/OFF ratio of the transistor increases. Accordingly, a normally-off mode SIT can be realized by appropriately selecting two types of organic semiconductor materials; and (5) the entirety of each electrode formed over the surface of the organic semiconductor layer can be efficiently used, and consequently, a large electric current can be produced.

By appropriately selecting the organic semiconductor material, the overall structure of the vertical organic transistor can be reduced. In addition, simple film formation by evaporation or coating allows the fabrication cost to be reduced.

By appropriately selecting the electrode material, the contact resistance can be reduced, and the electric characteristics can be improved.

By appropriately combining p-type and n-type organic semiconductor materials, a normally-off mode SIT that can produce a large quantity of electric current at higher operation speed can be realized.

Next, FIG. 12 through FIG. 21 illustrate a vertical organic semiconductor according to the second embodiment of the present invention.

Figure 12:
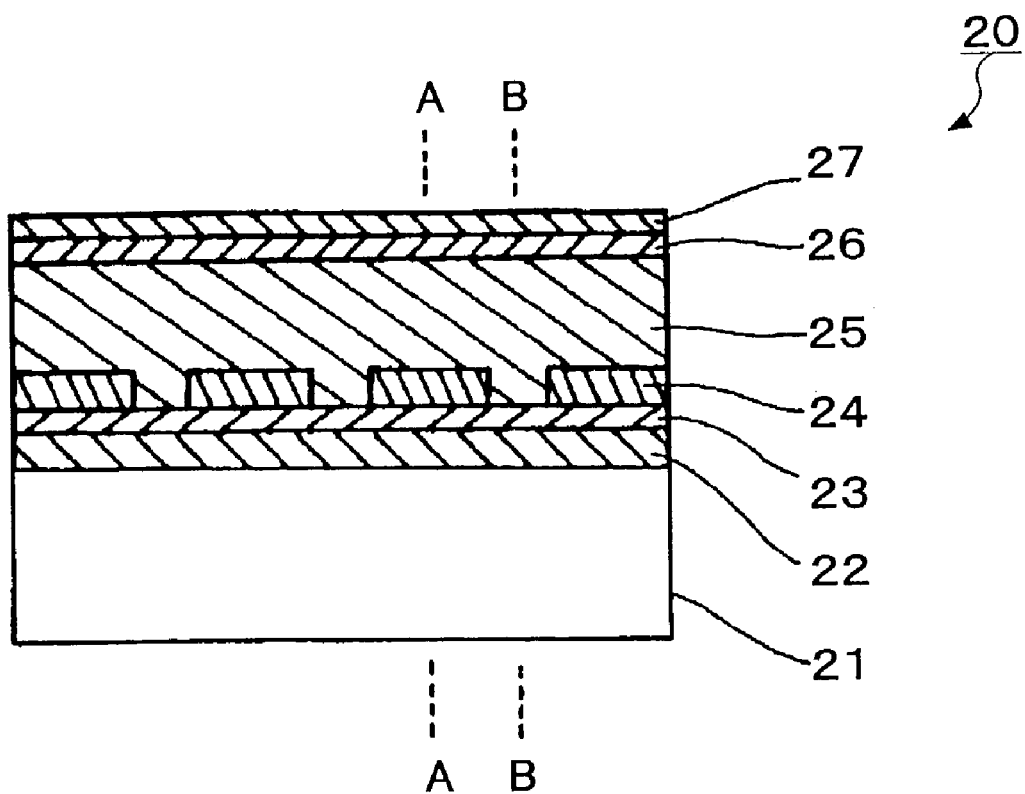
FIG. 12 is a cross-sectional view of the vertical organic transistor according to the second embodiment of the invention.

FIG. 12 illustrates a vertical organic transistor 20 according to the second embodiment of the invention. The vertical organic transistor 20 has a layered structure comprising a drain electrode 22, a first semiconductor layer 23, a gate electrode 24, a second semiconductor layer 25, a charge transport layer 26, and a source electrode 27, on the substrate 21. The gate electrode 24 is shaped into a comb-like electrode pattern or a meshed electrode pattern.

Although, in this example, the drain electrode 22 is formed on the substrate 21, the source electrode may be formed on the substrate 21. In this case, the layered structure becomes upside down. Although the charge transport layer 26 is inserted between the second semiconductor layer 25 and the source electrode 27 in the example shown in FIG. 12, the charge transport layer 26 may be omitted.

As in the first embodiment, the first and second semiconductor layers 23 and 25 are sandwiched between the drain electrode 22 and the source electrode 27. Unlike the first embodiment, while one of the first and second semiconductor layers 23 and 25 is made of an organic semiconductor material, the other layer is made of an inorganic semiconductor material.

The distance between the source electrode 27 and the drain electrode 22 is shortened, as compared with a lateral transistor, up to the total thickness of the first and second semiconductor layers 23 and 25. Accordingly, the pinch off point generated in the semiconductor layer of the conventional FET is shifted to the vicinity of the drain electrode 22 of the organic transistor 20. The effective channel length approaches zero, and the channel cannot control the electric current. This means that the rectification effect near the drain electrode 22 becomes dominant.

Figure 13:
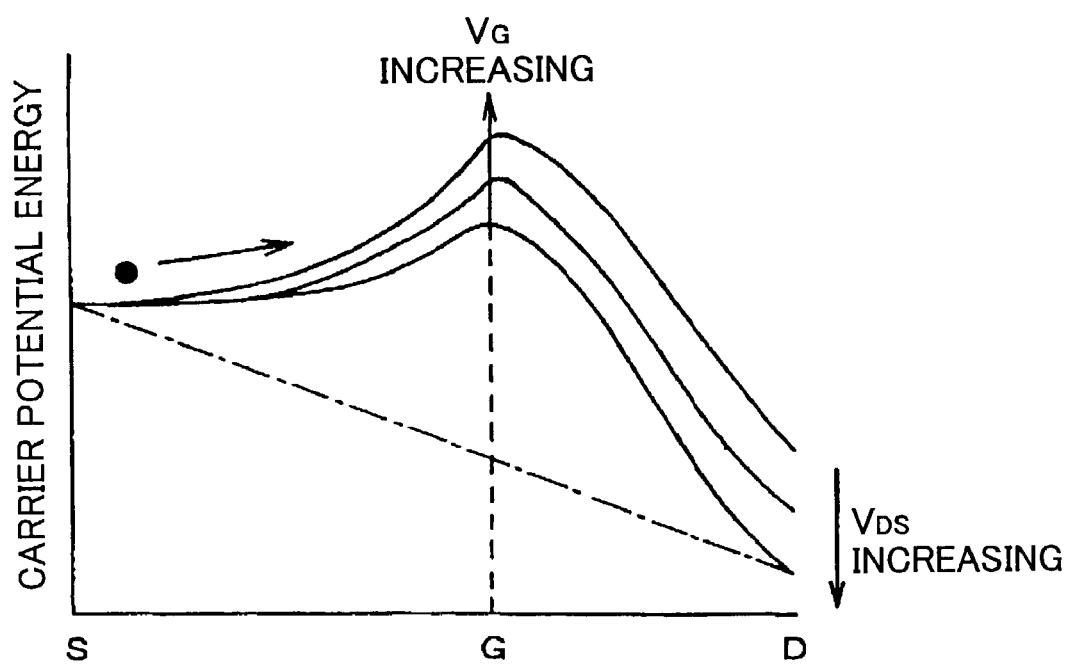
FIG. 13 is a graph showing the profile of the carrier potential energy between the source electrode (S) and the drain electrode (D) of the vertical organic transistor of the second embodiment.

FIG. 13 illustrates the profile of the carrier potential energy distribution between the source electrode 27 and the drain electrode 22. If a bias is applied between the drain electrode 22 and the source electrode 27, the carrier potential energy is sloped linearly, as indicated by the dashed line. However, since the potential position of the gate electrode 24 is unchanged, and therefore, the potential distribution profile illustrated in FIG. 13 is obtained. As a gate voltage $V_G$ is applied, the peak rises. As a drain voltage is applied to the drain electrode 22, the skirt of the mountain lowers.

Since bias is applied to the gate electrode 24 so that the depletion layer expands, namely, so that the potential barrier rises, large potential barrier is produced with respect to the carriers along the A—A line shown in FIG. 12. On the other hand, although the carrier potential energy along the B—B line is slightly raised due to the pull-up effect by the gate electrode 24, the carrier potential energy is basically small as compared with that along the A—A line, and therefore, the overall potential barrier with respect to the carrier is lowered. Consequently, carriers flow to the drain electrode 22 passing through the slit of the gate electrode 24. If the carrier potential at the drain electrode 22 is set to the reference level, the pinch off point is located higher than the reference by quantity of diffusion potential $\phi D$ generated at the interface with the semiconductor layer. In addition, the potential energy level of the gate electrode 24 becomes higher than the effective gate potential level by quantity of gate voltage $V_G$. For these reasons, the total potential barrier rises by setting the junction near the gate electrode 24. The height of the barrier due to the Heterojunction between the first and second semiconductor layers 23 and 25 can also be utilized in the second embodiment.

In the second embodiment, the first semiconductor layer 23 is made of, for example, an inorganic semiconductor material, while the second semiconductor layer 25 is made of an organic semiconductor material. The vertical organic semiconductor of the second embodiment has the following advantages.

(1) The channel length (that is, the electric current path length) of the organic transistor can be reduced up to the total thickness of the first and second semiconductor layers 23 and 25, and therefore, the operation speed can be improved with reduced resistance and increased electric current density. By using an inorganic semiconductor material, the operation speed can be further improved.

(2) The leakage current between the source drain electrode 22 and the gate electrode 24, and between the gate electrode 24 and the source electrode 27 can be reduced by effectively utilizing the Schottky contact and the barrier due to difference in HOMO level or LUMO level of the two different semiconductor materials. In addition, the ON/OFF ratio of the transistor is improved, and the response speed is improved.

(3) The gate electrode 24 can be precisely patterned into a comb-like electrode or a meshed electrode with the slit width at or below 1 $\mu$m, using photolithography, a lift-off technique, or metal etching, without using two-spot evaporation. Accordingly, the vertical organic transistor can be mass-produced with high productivity.

(4) The product yield is improved, and the fabrication cost can be reduced.

Preferably, the substrate 21, the drain electrode 22 and the first semiconductor layer 23 are transparent with respect to visible light. By selecting the materials of the substrate, the first electrode located directly above the substrate (the drain electrode in the example shown in FIG. 12), and the first semiconductor layer so as to be transparent with respect to visible light, the vertical organic transistor can function as an organic EL display device.

The drain electrode 22 and the first semiconductor layer 23 make ohmic contact with each other. Similarly, the source electrode 27 and the second semiconductor layer 25 make ohmic contact with each other if the charge transport layer 26 is not used. The gate electrode 24 and the first semiconductor layer 23 make Schottky contact. Similarly, the gate electrode 24 and the second semiconductor layer 25 make Schottky contact. Alternatively, at least one of the contact between the gate electrode 24 and the first semiconductor layer 23 and the contact between the gate electrode 24 and the second semiconductor layer 25 may be Schottky contact.

Lowering the carrier injection barrier between the drain electrode 22 and the first semiconductor layer 23, or between the source electrode 27 and the second semiconductor layer 25 leads to reduction of voltage applied to the electrode. Raising the carrier injection barrier between the electrode and the semiconductor layer leads to raising a voltage applied to the electrode. Metals or some organic materials having metal-like properties do not always exhibit the rectification characteristic. Concerning metal and p-type organic semiconductor material, if the work function $\phi m$ of the electrode material is greater than the work function $\phi s$ of p-type organic semiconductor material ($\phi m > \phi s$) with a small difference between these work functions, then the electrode and the p-type organic semiconductor material make contact in a similar manner to ohmic contact. With respect to electrons, if the electron affinity $\chi m$ of the electrode is greater than that of the organic semiconductor material ($\chi m = \phi m > \chi s$) with a small difference between them, the electrode and the p-type organic semiconductor material make contact in a similar manner to ohmic contact.

With respect to holes, achieving ohmic contact is not so difficult if a metal or a metal-like material having the work function $\phi m$ slightly greater than the work function of the electrode or the HOMO (Highest Occupied Molecular Orbital) level is selected. With respect to electrons, achieving ohmic contact is not so difficult if a metal or a metal-like material having the electron affinity $\chi m$ (which equal $\phi m$) slightly greater than the electron affinity of the electrode and the LUMO (Lowest Unoccupied Molecular Orbital) level is selected. In this manner, the driving voltage can be reduced.

If the work function of the electrode material satisfies $\phi m < \phi s$ with a large difference between them, Schottky contact is achieved. For the holes, an energy level of inside the organic semiconductor material is lower than the surface by quantity of $\phi s - \phi m$, and an energy barrier is produced inside the organic semiconductor material. The energy barrier on the metal side is expressed as $$\phi sb = (\chi s + [(HOMO\ level) - (LUMO\ level)]) - \chi m,$$

and the diffusion potential becomes $\phi s - \phi m$.

The first semiconductor layer 23 of the second embodiment may be made of an inorganic semiconductor material, and more preferably, an electrically conductive metal oxide. Examples of electrically conductive metal oxide include, but are not limited to, (1) at least one of the first-type metal oxides selected from the group consisting of tin oxide, titanium oxide, germanium oxide, copper oxide, silver oxide, indium oxide, tantalum oxide, barium titanate, strontium titanate, lanthanum chromate, tungsten oxide, europium oxide, aluminum oxide, and lead chromate, each of which exhibits high conductivity because of an oxygen hole or an interstitial metal produced due to its composition offset from the stoichiometric ratio; (2) at least one of the second-type metal oxides selected from the group consisting of rhenium oxide, titanium oxide, lanthanum titanate, lanthanum nickelate, copper lanthanum oxide, copper ruthenium oxide, iridium strontium oxide, strontium chromate, lithium titanate, iridium oxide, and molybdenum oxide, each of which exhibits a highest conductivity at the stoichiometric ratio; (3) at least one of the electrically conductive metal oxides selected from the group consisting of vanadium oxide, chromium oxide, calcium iron oxide, iron strontium oxide, cobalt strontium oxide, strontium vanadium oxide, ruthenium strontium oxide, cobalt lanthanum oxide, and nickel oxide; and (4) at least one of electrically conductive metal oxide bronze selected from the group consisting of a tungsten bronze ($M_xWO_3$) a molybdenum bronze ($M_xMoO_3$), and a rhenium bronze ($M_xReO_3$), which has a hydrogen atom, an alkali metal atom, an alkali-earth metal atom, or a rare-earth atom at an empty A-atom position (i.e., at the center of unit lattice) of the perovskite structure of tungsten oxide, molybdenum oxide, and rhenium oxide.

The inorganic semiconductor material used in the first semiconductor layer may be a semi-conductive metal oxide. Examples of semi-conductive metal oxide include, but are not limited to (a) an n-type semiconductor material selected from the group consisting of zinc oxide, titanium oxide, tin oxide, indium oxide, aluminum oxide, niobium oxide, tantalum pentoxide, barium titanate, and strontium titanate, (b) a p-type semiconductor material selected from the group consisting of nickel oxide, cobalt oxide, iron oxide, manganese oxide, chromium oxide, and bismuth oxide, and (c) an n-type or p-type semiconductor material obtained by doping impurities into the above-described electrically conductive metal oxide (i.e., one of (1) the first-type metal oxide, (2) the second-type metal oxide, (3) the electrically conductive metal oxide, and (4) electrically conductive metal oxide bronze) or the above-described semi-conductive metal oxide (i.e., one of (a) the n-type semiconductor material, and (b) the p-type semiconductor material).

It is known that undoped zinc oxide (ZnO), or zinc oxide doped with group-III elements, such as aluminum (Al), gallium (Ga), indium (In), and boron (B) exhibits properties of an n-type semiconductor, and that its carrier concentration is controllable. It has been reported recently that zinc oxide doped with nitrogen exhibits properties of a p-type semiconductor. The energy band gap of the zinc oxide (ZnO) is 3.3 eV to 3.6 eV at room temperature In contrast, Alq$_3$, which is an organic material exhibiting a property of a p-type semiconductor has a HOMO level of 5.7 eV and a LUMO level of 3.0 eV. If an inorganic material and an organic material are layered taking into account the work function of an electrode material, the barrier created at the interface of the metal oxide material with respect to electrons and holes agrees with the Mott-Schottky model. Accordingly, charges flow to and fro so that (1) the vacuum levels of the two layers agree with each other at the interface, and that (2) the Fermi levels of the two layers agree with each other. The band bends near the interface. On the other hand, the barrier created at the interface of the organic semiconductor corresponds to the difference in HOMO levels and difference in LUMO levels of the two layers.

Consequently, by introducing the phenomenon discussed with the Mott-Schottky model and the interface level-connection model represented by HOMO level difference and LUMO level difference into a single device structure, and by efficiently making use of the Schottky gate barrier and the ohmic junction, a vertical organic transistor having a novel operation mechanism can be realized.

The second semiconductor layer 25 of the second embodiment is made of an organic semiconductor material. Examples of organic semiconductor material include, but are not limited to, (1) at least one kind of linearly condensed polycyclic aromatic compound (acene compound) selected from the group consisting of naphthalene, anthracene, tetracene, pentacene, hexacene, and derivatives thereof; (2) at least one kind of pigment selected from the group consisting of copper-phthalocyanine(CuPc)-based compounds, azo compounds, perylene-based compounds, and derivatives thereof; (3) at least one kind of low-molecular compound selected from the group consisting of hydrazone compounds, triphenylmethane-based compounds, diphenylmethane-based compounds, stilbene-based compounds, arylvinyl compounds, pyrazoline-based compounds, triphenylamine derivatives (TPD), triarylamine compounds, low-molecular weight arylamine derivatives ($\alpha$-NPD), 2,2',7,7'-tetrakis(diphenylamino)-9,9'-spirobifluorene (Spiro-TAD), N,N'-di(1-naphthyl)-N,N'-diphenyl-4,4'-diamonobiphenyl (Spiro-NPB), 4,4',4''-tris[N-3-methylphenyl-N-phenylamino]-triphenylamine (mMTDATA), 2,2',7,7'-tetrakis(2,2-diphenylvinyl)-9,9-spirobifluorene (Spiro-DPVBi), 4,4'-bis(2,2-diphenylvinyl)biphenyl (DPVBi), (8-quinolinolato)aluminum (Alq), tris(8-quinolinolato)aluminum ($Alq_3$), tris(4-methyl-8-quinolinolato)aluminum ($Almq_3$), and derivatives thereof; and (4) at least one kind of polymer compound selected from the group consisting of poly(p-phenylenevinylene) (PPV), polymers containing biphenyl groups, polymers having dialkoxy groups, alkoxyphenyl-PPV, phenyl-PPV, phenyl/dialkoxy-PPV copolymer, poly(2-methoxy-5-(2'-ethylhexyloxy)-1,4-phenylenevinylene) (MEH-PPV), poly(ethylenedioxythiophene) (PEDOT), poly(styrenesulfonic acid) (PSS), poly(aniline) (PANI), poly(N-vinylcarbazole), halogenated poly(N-vinylcarbazole), poly(vinylpyrene), poly(vinylanthracene), pyrene-folmaldehyde resin, ethylcarbazole-folmaldehyde resin, and modifications thereof.

Preferably, the second semiconductor layer 25 is made of organic luminous material. Examples of luminous material include, but are not limited to, (1) at least one kind of low-molecular compound selected from the group consisting of the above-described spiro-TAD, spiro-NPB, mMTDATA, spiro-DPVBi, DPVBi, Alq, $Alq_3$, $Almg_3$ and derivatives thereof, and (2) at least one kind of polymer compound selected from the group consisting of PPV, alkoxy-monomer, ph alkoxyphenyl-PPV, phenyl-PPV, phenyl/dialkoxy-PPV copolymer, MEH-PPV, and modifications thereof.

Preferably, the vertical organic transistor 20 of the second embodiment has a charge transport layer 26 between the second semiconductor layer 25 and the third electrode (i.e., the source electrode in the example shown in FIG. 12). Examples of material of the charge transport layer 26 include, but are not limited to, (1) at least one kind of low-molecular compound selected from the group consisting of triphenylamine derivatives (TPD), triarylamine compounds, low-molecular weight arylamine derivatives ($\alpha$-NPD), 2,2',7,7'-tetrakis(diphenylamino)-9,9'-spirobifluorene (Spiro-TAD), N,N'-di(1-naphthyl)-N,N' -diphenyl-4,4'-diamonobiphenyl (Spiro-NPB), 4,4',4''-tris[N-3-methylphenyl-N-phenylamino]-triphenylamine (mMTDATA), and derivatives thereof; and (2) at least one kind of polymer compound selected from the group consisting of poly(ethylenedioxythiophene) (PEDOT), poly(styrenesulfonic acid) (PSS), poly(aniline) (PANI), and modifications thereof.

In the second embodiment, the second semiconductor layer 25 and the charge transport layer 26 are made of an organic semiconductor material. This arrangement allows the overall structure of the vertical organic transistor to be made compact, and the fabrication cost can be reduced.

The second semiconductor layer 25 and the charge transport layer 26 using the above-described organic semiconductor materials are formed by vacuum evaporation, chemical vapor deposition, spin coating, printing, coating/baking, electro polymerization, molecular beam epitaxy, self-assembling from solution, and any combinations thereof. Accordingly, a simple technique, such as vacuum evaporation or coating, can be employed to form the organic semiconductor layer, and the fabrication cost can be further reduced.

The drain electrode 22, the gate electrode 24, and the source electrode 27 are made of at least one material selected from the group consisting of chromium (Cr), tantalum (Ta), titanium (Ti), copper (Cu), aluminum (Al), molybdenum (Mo), tungsten (W), nickel (Ni), gold (Au), palladium (Pd), platinum (Pt), silver (Ag), tin (Sn), lithium (Li), calcium (Ca), oxides thereof, electrically conductive oxide such as indium tin oxide (ITO), electrically conductive poly(aniline), electrically conductive poly(pyrrole), electrically conductive poly(thiazyl) and electrically conductive polymer. By selecting the electrode material from the above-described materials, the contact resistance is reduced, and the electric characteristics of the vertical organic transistor can be improved. These electrode materials can be formed into the drain electrode 22, the gate electrode 24, and the source electrode 27 by vacuum evaporation, spattering, chemical vapor deposition, electrodeposition, electroless plating, spin coating, printing, coating, and other suitable process.

The substrate of the vertical organic transistor may be made of glass, plastic, quartz, undoped silicon, highly-doped silicon, and other suitable material. If a plastic substrate is used, polycarbonate, miler resin, polyimide may be used.

In the second embodiment, the gate electrode 24 is made of aluminum (Al) film with a thickness of 100 nm or less, and preferably, a thickness ranging from 40 nm to 60 nm. The source electrode 27 and the drain electrode 22 have a thickness of 100 nm to 500 nm.

FIG. 14A through FIG. 14F illustrate an example of the fabrication process of the vertical organic transistor according to the second embodiment of the invention.

Figure 14A:
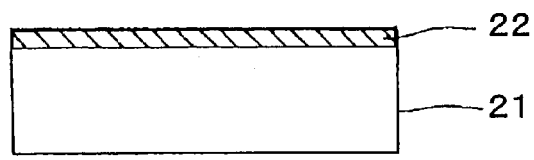
FIG. 14A through FIG. 14F illustrate a fabrication process of the vertical organic transistor according to the second embodiment.
Figure 14B:
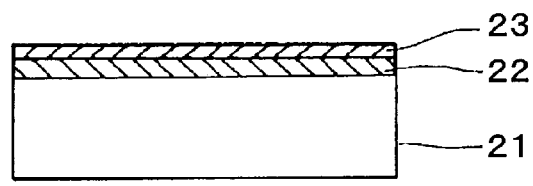

First, as illustrated in FIG. 14A, drain electrode 22 is formed on the substrate 21, Then, as illustrated in FIG. 14B, the first semiconductor layer 23 is formed on over the drain electrode 22 using an inorganic semiconductor material.

Figure 14C:
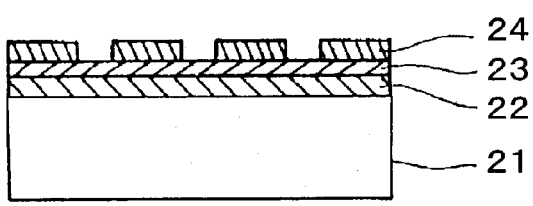

Then, as illustrated in FIG. 14C, a comb-like or meshed gate electrode 24 is formed over the first semiconductor layer 23, using an electrode material.

Figure 14D:
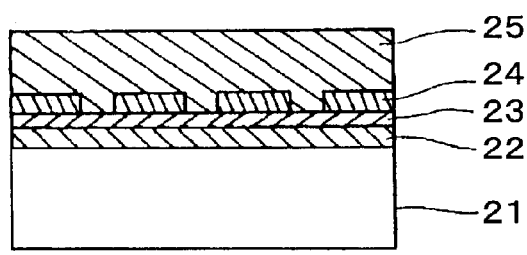

Then, as illustrated in FIG. 14D, the second semiconductor layer 25 is formed over the gate electrode 24 and the first semiconductor layer 23, using an organic semiconductor material.

Figure 14E:
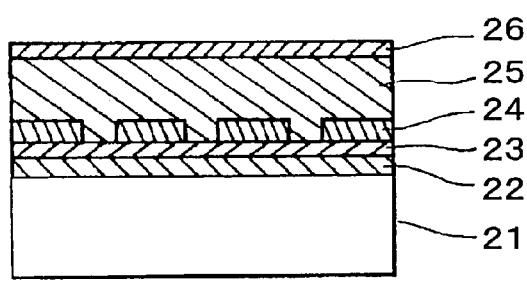

Then, as illustrated in FIG. 14E, a charge transport layer 26 is formed over the second semiconductor layer 25, using a charge transport material.

Figure 14F:
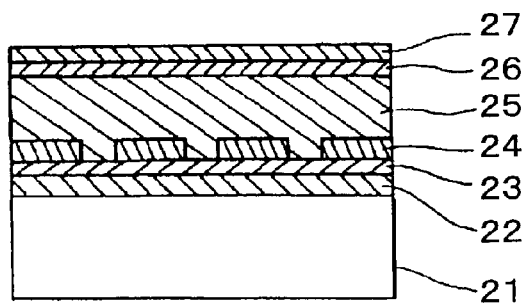

Finally, as illustrated in FIG. 14F, the source electrode 27 is formed over the charge transport layer 26 using an electrode material.

Next, actual examples of the vertical organic transistor of the second embodiment will be described below.

EXAMPLE 1

(a) An ITO transparent electrode layer comprised of Indium oxide and Tin oxide is formed by spattering over the transparent glass substrate (e.g., non-alkali glass 1737F manufactured by Corning Inc.) with a thickness of 0.7 mm, whereby the drain electrode 22 with a thickness of 110 nm is formed.

(b) Then, ZnO, which is an n-type semiconductor material, is sputtered over the drain electrode 22 at room temperature under the vacuum condition of $1\times10^{-3}$ torr to $1.3\times10^{-3}$ torr, in order to form the first semiconductor layer 23 with a thickness of 60 nm.

(c) Then, resist (OFRR800 manufactured by Tokyo Ouka Co., Ltd.) is applied over the first semiconductor layer 23, and delineated into a striped pattern, Then, gold (Au) is vacuum-evaporated under resistance heating at $1\times10^{-6}$ torr, thereby forming the gate electrode 24 with a thickness of 50 nm.

(d) Then, $Alq_3$, which is an n-type organic luminescent semiconductor material, is vacuum-evaporated onto the gate electrode 24 and the first semiconductor ZnO layer 23 under resistance heating at $2\times10^{-6}$ torr to $3\times10^{-6}$ torr, thereby forming the second semiconductor ($Alq_3$) layer 25 with a thickness of 60 nm is formed.

(e) Then, α-NPD, which is a charge transport material, is vacuum-evaporated over the second semiconductor ($Alq_3$) layer 25 under resistance heating at $6\times10^{-6}$ Torr to form the charge transport (α-NPD) layer 26 with a thickness of 80 nm.

(f) Finally, a gold (Au) layer is formed over the α-NPD charge transport layer 26 by vacuum evaporation under resistance heating at $1\times10^{-6}$ torr to form the source electrode 27 with a thickness of 100 nm.

Figure 15:
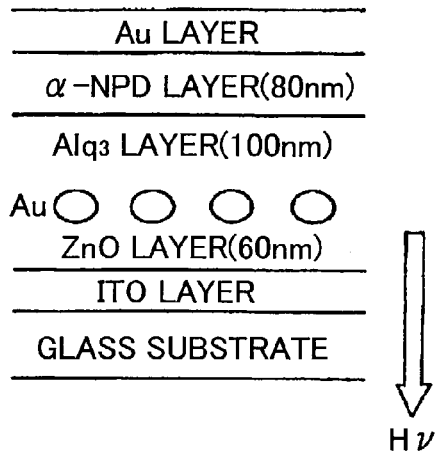
FIG. 15 is a schematic cross-sectional view of the vertical organic transistor of Example 1 fabricated by the fabrication process of the second embodiment.

FIG. 15 illustrates the vertical organic transistor fabricated by the above-described process. The white arrow indicates the direction of the energy radiation.

EXAMPLE 2

In the above-described step (a), ZnO, which is an n-type semiconductor material, is sputtered over the substrates 21 at room temperature under the vacuum condition at $1\times10^{-3}$ torr to $1.3\times10^{-3}$ torr. The ZnO layer functions as both the drain electrode and the first semiconductor layer. In this case, the above-described step (b) is omitted. Other steps are the same as those in Example 1.

Figure 16:
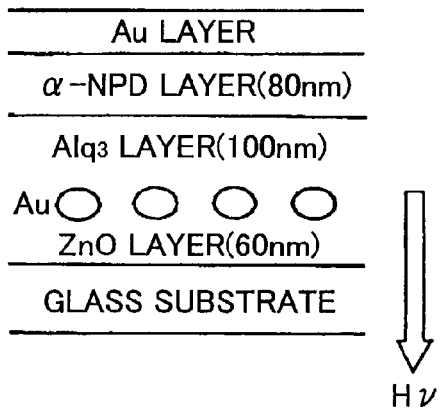
FIG. 16 is a schematic cross-sectional view of the vertical organic transistor of Example 2 of the second embodiment.

The vertical organic transistor fabricated in Example 2 is illustrated in FIG. 16.

EXAMPLE 3

In the above-described step (c), the gate electrode 24 formed made of platinum (Pt) by a film deposition technique. Other steps are the same as those in Example 2.

EXAMPLE 4

In the above-described step (c), the gate electrode 24 is formed of palladium (Pd) by a film deposition technique. Other steps are the same as those in Example 2.

EXAMPLE 5

In the above-described step (d), the second semiconductor layer 25 is formed of spiro-NPB by a film deposition technique, which is also an organic semiconductor material. Other steps are the same as those in Example 1.

EXAMPLE 6

In the above-descried step (d), the second semiconductor layer 25 is formed of DPVBi by a film deposition technique. Other steps are the same as those in Example 1.

EXAMPLE 7

In the above-described step (d), the second semiconductor layer 25 is formed of Alq by a film deposition technique. Other steps are the same as those in Example 1.

EXAMPLE 8

In the above-described step (d), the second semiconductor layer 25 is formed of spiro-NPB by a film deposition technique. Other steps are the same as those in Example 1.

EXAMPLE 9

In the above-descried step (d), the second semiconductor layer 25 is formed by applying PPV solution onto the gate electrode 24 and the first semiconductor layer 23. Other steps are the same as those in Example 1.

EXAMPLE 10

In the above-described step (d), the second semiconductor layer 25 is formed by applying alkoxyphenyl-PPV solution onto the gate electrode 24 and the first semiconductor layer 23. Other steps are the same as those in Example 1.

EXAMPLE 11

In the above-described step (e), the charge transport layer 26 is formed of spiro-TAD by a film deposition technique. Other steps are the same as those in Example 1.

EXAMPLE 12

Figure 17:
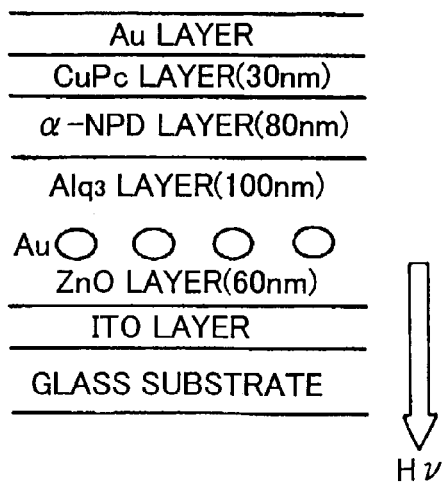
FIG. 17 is a schematic cross-sectional view of the vertical organic transistor of Example 12 of the second embodiment.

In the above-described step (f), α-NPD layer with a thickness of 80 nm is formed over the second semiconductor layer 25, and successively, a CuPc layer with a thickness of 30 nm is formed over the α-NPD layer, so that the charge transport layer 26 has a two-layer structure. Other steps are the same as those in Example 1. The vertical organic transistor fabricated in Example 12 is illustrated in FIG. 17.

EXAMPLE 13

In the above-described step (f), the charge transport layer 26 is formed by applying PEDOT solution. Other steps are the same as those in Example 1.

EXAMPLE 14

In the above-described step (f), the charge transport layer 26 is formed by applying PPS solution. Other steps are the same as those in Example 1.

Figure 18:
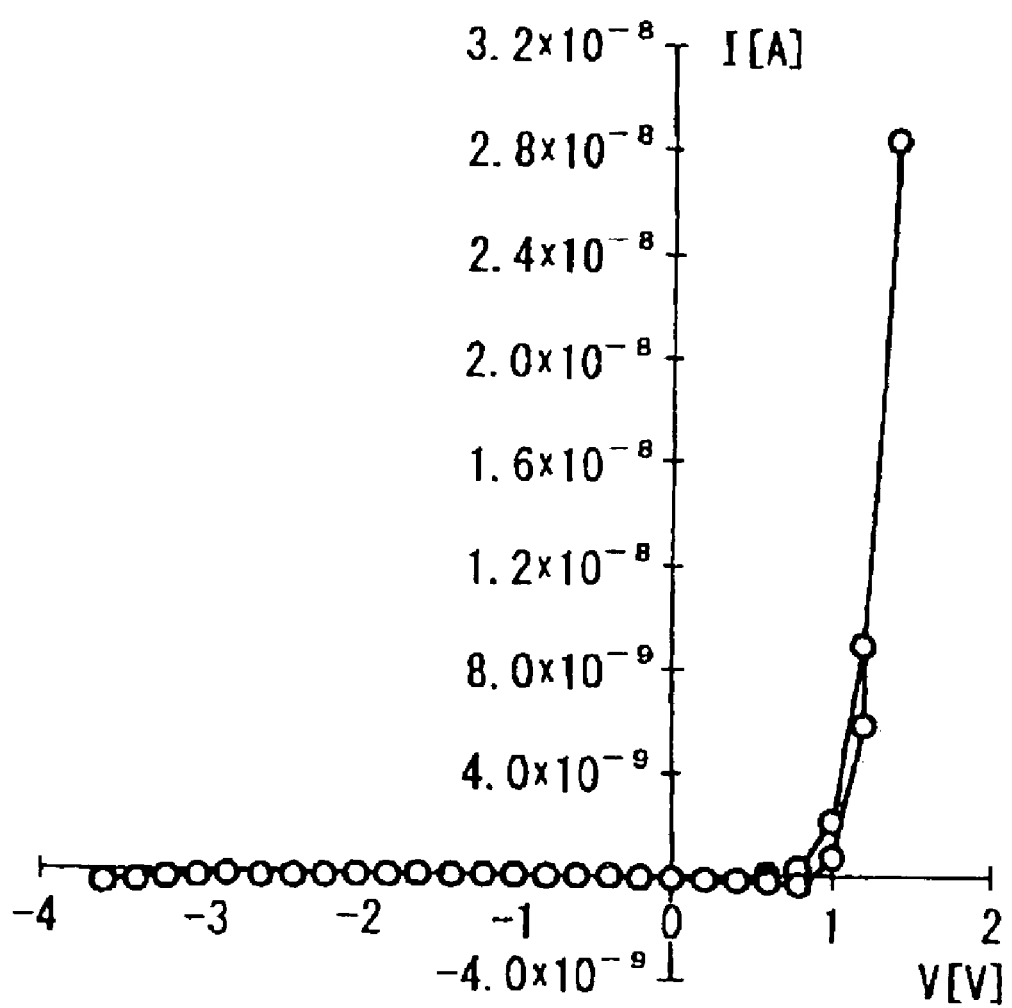
FIG. 18 illustrates the I-V characteristic between the source electrode and the gate electrode of the vertical organic transistor according to the second embodiment.

FIG. 18 illustrates the I-V characteristic between the first electrode and the second electrode using the vertical organic transistor of Example 1. Therefore, the I-V characteristic is measured between the ITO drain electrode and the Au gate electrode of the Au/ZnO/ITO layered structure on the glass substrate.

Figure 19:
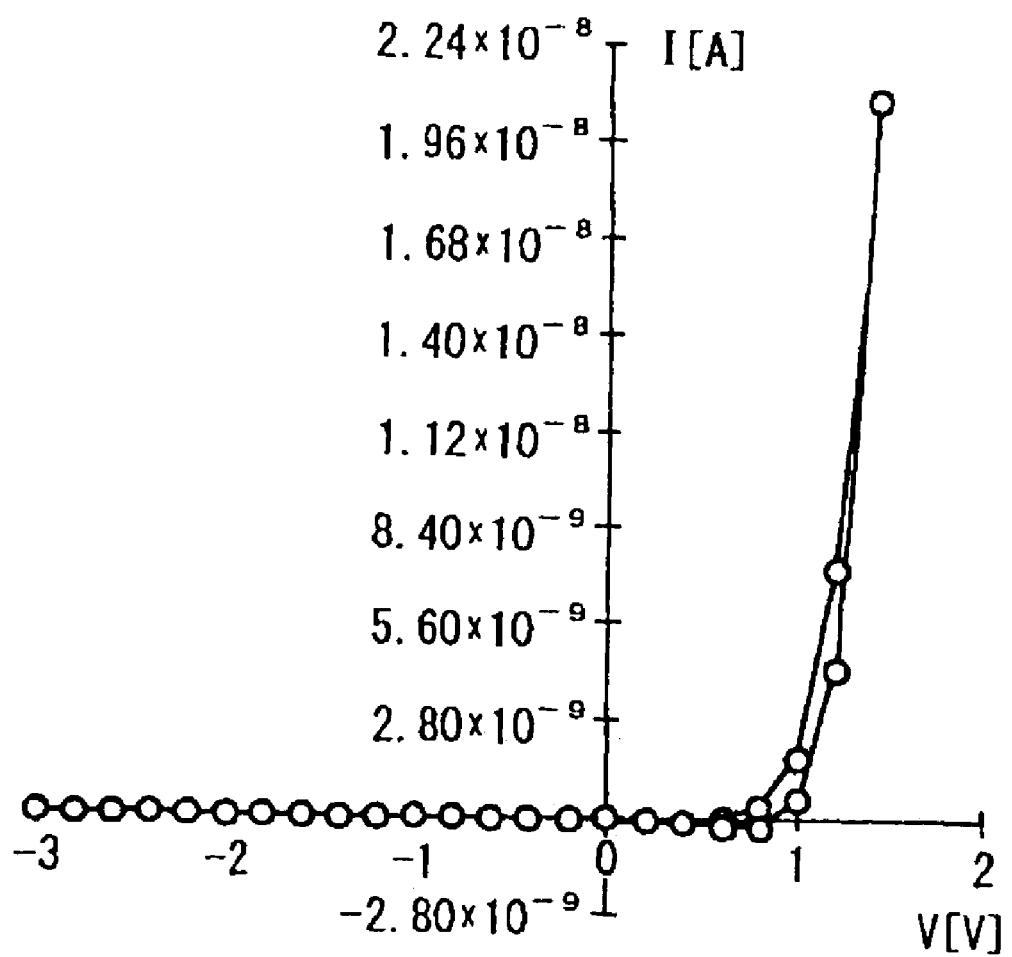
FIG. 19 illustrates the I-V characteristic between the gate electrode and the drain electrode of the vertical organic transistor according to the second embodiment.

FIG. 19 illustrates the I-V characteristic between the second electrode and the third electrode using the layered structure of Au/Alq$_3$/ZnO/ITO.

Figure 20:
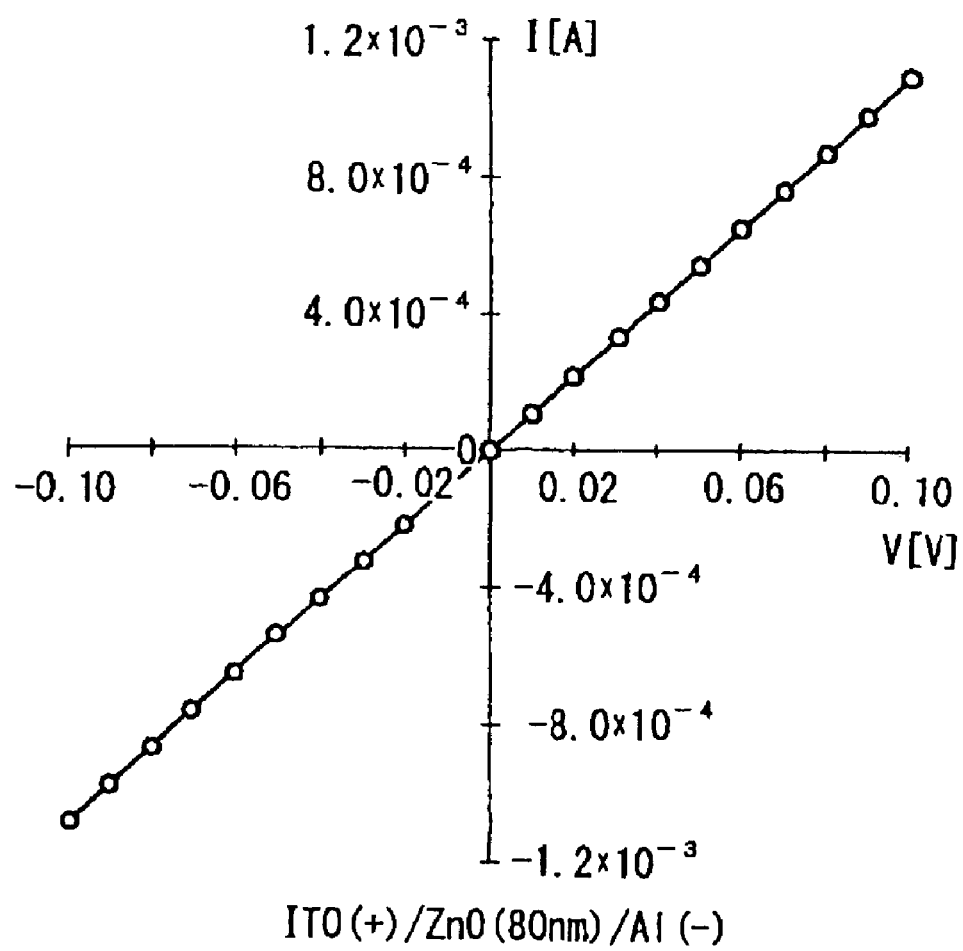
FIG. 20 illustrates the I-V characteristic between the gate electrode and the first and second semiconductor layers of the vertical organic transistor according to the second embodiment.

FIG. 20 illustrates the I-V characteristic between the first electrode, the first semiconductor layer, and the second electrode, using the layered structure of ITO/ZnO/Al.

Figure 21:
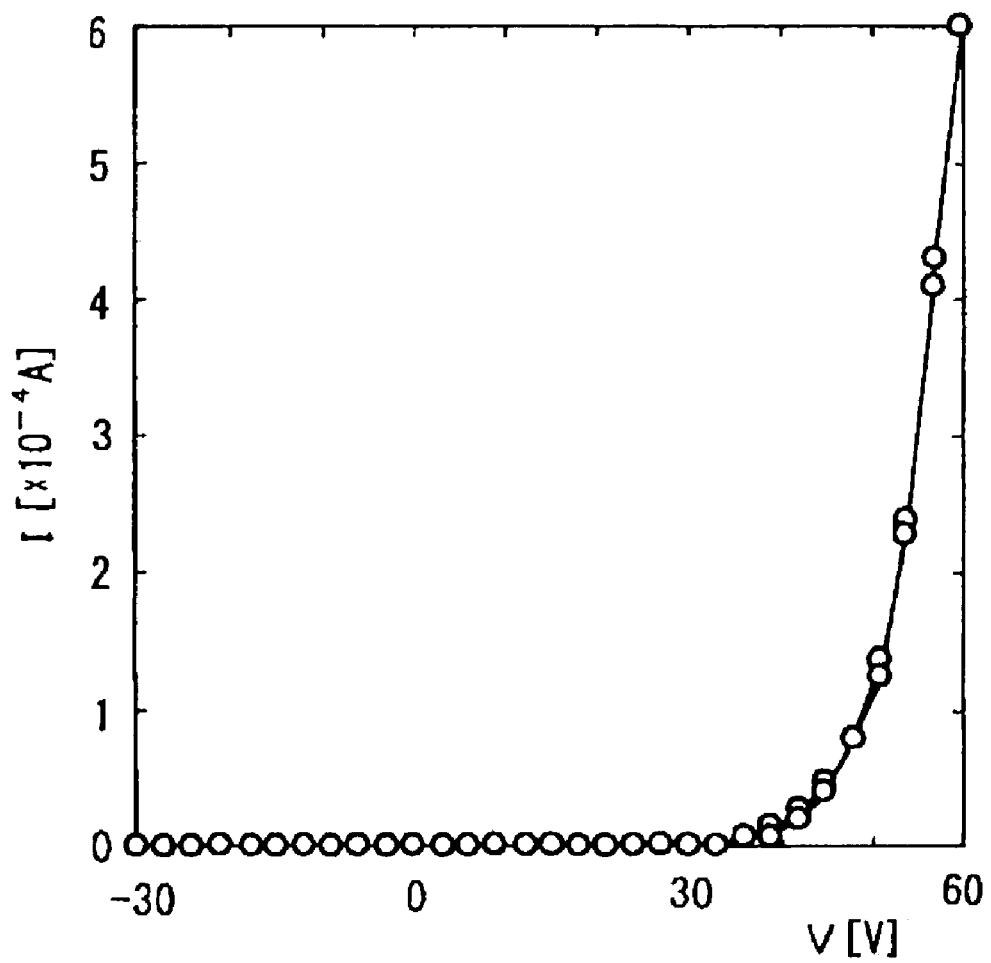
FIG. 21 illustrates the I-V characteristic between the source electrode and the drain electrode of the vertical organic transistor according to the second embodiment.

FIG. 21 illustrates the I-V characteristic between the first electrode and the third electrode of the vertical organic transistor of Example 1. The I-V characteristic is measured between the source electrode 27 and the drain electrode 22 of the layered structure of Au/α-NPD/Alq$_3$/Au/ZnO/ITO on the glass substrate.

From the measurement results shown in FIG. 18 and FIG. 19, the characteristic curve steeply rises near 1.0 volt, unlike the source-drain I-V characteristic shown in FIG. 21. This shows that a Schottky junction is created between the gate electrode 24 and the first semiconductor layer 23 (FIG. 18), and between the gate electrode 24 and the second semiconductor layer 25 (FIG. 19). Accordingly, the potential barrier between adjacent gate electrodes can be varied by adjusting the depletion layer due to the Schotkky junction of the gate electrode, and therefore, the carrier injection from the first electrode to the third electrode.

In the example shown in FIG. 18, the rising voltage is 1.0 volt, and the break down voltage is about −3.5 volts. In the example shown in FIG. 19, the rising voltage is 1.2 volts, and the breakdown voltage is about −3.0 volts.

From the measurement result shown in FIG. 21, the diode characteristic of the vertical organic transistor of the second embodiment can be confirmed. The rising voltage of the vertical organic transistor is 40 volts.

In this manner, the vertical organic transistor of the second embodiment makes use of the PN barrier between the first semiconductor layer 23 and the second semiconductor layer 25, as well as the Schottky barrier near around the gate electrode 24 (between the gate electrode 24 and the first semiconductor layer 23, and between the gate electrode 24 and the second semiconductor layer 25). This arrangement can reduce the leakage current, while increasing the ratio of the ON current to the OFF current. In addition, the carrier injection from the gate electrode can be reduced, and the response speed can be improved.

Concerning the vertical organic transistors obtained in Examples 2 through 14, the I-V characteristics were measured, and the similar results were obtained.

The vertical organic transistor of the second embodiment has the following advantages.

(1) The channel length of the transistor can be reduced up to the total thickness of the first and second semiconductor layers, and therefore, the operation resistance is reduced and operation speed is improved with the electric current density increased. In addition, by using an inorganic semiconductor material for either the first or second semiconductor layer, the operation speed can be further improved.

(2) By making efficient use of the potential barrier due to the Schottky contact near the gate electrode and the potential barrier due to difference in HOMO levels or LUMO levels of two different types of semiconductor materials, the leakage current between the source and the drain can be reduced, while improving the ON/OFF ratio. Consequently, the response speed can be improved.

(3) The comb-like or meshed gate electrode can be fabricated precisely using photolithography, a lift-off process, and metal etching, without using the conventional two-spot evaporation. The slit width of the gate electrode can be controlled at or below 1 μm. Accordingly, the vertical organic transistor can be mass-produced at high productivity.

(4) The yield is improved, and the fabrication cost can be reduced.

Although the present invention has been described based on specific embodiments, the present invention is not limited to these example. Many substitutions and modifications can be made by those skilled in the art without departing from the scope of the invention. For example, although in the embodiments the gate electrode is shaped into a striped pattern, such as a comb-like pattern or a meshed pattern, the gate electrode may be shaped into a desired pattern as long as a part of the first semiconductor layer and a part of the second semiconductor layer make contact with each other.

This patent application is based on and claims the benefit of the earlier filing dates of Japanese patent application No. 2002-159138 filed May 31, 2002 and Japanese patent application No. 2002-286815, filed Sep. 30, 2002, the entire contents of which are hereby incorporated by reference.

What is claimed is:

1. A vertical organic transistor comprising:
   a substrate;
   a first electrode positioned over the substrate;
   a first semiconductor layer formed over the first electrode;
   a second electrode formed on the first semiconductor layer and shaped into a prescribed pattern;
   a second semiconductor layer formed over the second electrode and the first semiconductor layer, the second semiconductor layer being made of a different material from that of the first semiconductor layer; and
   a third electrode formed over the second semiconductor layer,
   wherein at least one of the first and second semiconductor layers are made of an organic semiconductor material, and
   one of the first and second semiconductor layers is of a first conductivity type, while the other is of a second conductivity type.

2. A vertical organic transistor comprising:
   a substrate;
   a first electrode positioned over the substrate;
   a first semiconductor layer formed over the first electrode;
   a second electrode formed on the first semiconductor layer and shaped into a prescribed pattern;
   a second semiconductor layer formed over the second electrode and the first semiconductor layer, the second semiconductor layer being made of a different material from that of the first semiconductor layer; and
   a third electrode formed over the second semiconductor layer,
   wherein one of the first and second semiconductor layers is made of an organic semiconductor material, while the other is made of an inorganic semiconductor material.

3. A vertical organic transistor comprising:
   a substrate;
   a first electrode positioned over the substrate;
   a first semiconductor layer formed over the first electrode;
   a second electrode formed on the first semiconductor layer and shaped into a prescribed pattern;
   a second semiconductor layer formed over the second electrode and the first semiconductor layer, the second semiconductor layer being made of a different material from that of the first semiconductor layer; and a third electrode formed over the second semiconductor layer, wherein at least one of the first and second semiconductor layers are made of an organic semiconductor material, one of the first and second semiconductor layers is of a first conductivity type, while the other is of a second conductivity type, and the second electrode and the first semiconductor layer make Schottky contact at the interface between them.

4. A vertical organic transistor comprising:

a substrate;

a first electrode positioned over the substrate;

a first semiconductor layer formed over the first electrode;

a second electrode formed on the first semiconductor layer and shaped into a prescribed pattern;

a second semiconductor layer formed over the second electrode and the first semiconductor layer, the second semiconductor layer being made of a different material from that of the first semiconductor layer; and a third electrode formed over the second semiconductor layer, wherein at least one of the first and second semiconductor layers are made of an organic semiconductor material, one of the first and second semiconductor layers is of a first conductivity type, while the other is of a second conductivity type, and the second electrode and the second semiconductor layer make Schottky contact at the interface between them.

5. A vertical organic transistor comprising:

a substrate;

a first electrode positioned over the substrate;

a first semiconductor layer formed over the first electrode;

a second electrode formed on the first semiconductor layer and shaped into a prescribed pattern;

a second semiconductor layer formed over the second electrode and the first semiconductor layer, the second semiconductor layer being made of a different material from that of the first semiconductor layer; and a third electrode formed over the second semiconductor layer, wherein one of the first and second semiconductor layers is of a first conductivity type, while the other is of a second conductivity type, wherein at least one of the first and second semiconductor layers are made of an organic semiconductor material, and wherein the organic semiconductor material includes:

(1) at least one kind of linearly condensed polycyclic aromatic compound (acene compound) selected from the group consisting of naphthalene, anthracene, tetracene, pentacene, hexacene, and derivatives thereof;

(2) at least one kind of pigment selected from the group consisting of copper-phthalocyanine(CuPc)-based compounds, azo compounds, perylene-based compounds, and derivatives thereof; (3) at least one kind of low-molecular compound selected from the group consisting of hydrazone compounds, triphenyl methane-based compounds, diphenylmethane-based compounds, stilbene-based compounds, arylvinyl compounds, pyrazoline-based compounds, triphenyl amine derivatives (TPD), In arylamine compounds, low-molecular weight arylamine derivatives (α-NPD), 2,2′,7,7′-tetrakis(diphenylamino)-9,9′-spirobifluorene (Spiro-TAD), N,N′-di(1-naphthyl)-N,N′-diphenyl-4,4′-diamonobiphenyl (Spiro-NPB), 4,4′,4″-tris[N-3-methylphenyl-N-phenylamino]-triphenylamine (mMT-DATA), 2,2′,7,7′-tetrakis(2,2-diphenylvinyl)-9,9-spirobifluorene (Spiro-DPVBi), 4,4′-bis(2,2-diphenylvinyl)biphenyl (DPVBi), (8-quininolinolato) aluminum (Alq), tris(8-quinolinolato)aluminum ($Alq_3$), tris(4-methyl-8quinolinolato)aluminum ($Almq_3$), and derivatives thereof; and (4) at least one kind of polymer compound selected from the group consisting of poly(p-phenylenevinylene) (PPV), polymers containing biphenyl groups, polymers having dialkoxy groups, alkoxyphenyl-PPV, phenyl-PPV, phenyl/dialkoxy-PPV copolymer, poly(2-methoxy-5-(2′-ethylhexyloxy)-1,4-phenylenevinylene) (MEH-PPV), poly(ethylenedioxythiophene) (PEDOT), poly(styrene-sulfonic acid) (PSS), poly(aniline) (PANI), poly(N-vinylcarbazole), halogenated poly(N-vinylcarbazole), poly(vinylpyrene), poly(vinylanthracene), pyrene-folmaldehyde resin, ethylcarbazole-folmaldehyde resin, and modifications thereof.

6. The vertical organic transistor according to claim 1, wherein one of the first and second conductivity types is n-type, and the other is p-type.

7. The vertical organic transistor according to one of claim 2, wherein the first and second semiconductor layers are of a same conductivity type.

8. The vertical organic transistor according to one of claims 2, 3, 4 and 5, wherein the first and second semiconductor layers are of opposite conductivity types.

9. The vertical organic transistor according to one of claims 2, 3, 4 and 5, wherein the first electrode and the first semiconductor layer make ohmic contact at the interface between them.

10. The vertical organic transistor according to one of claims 2, 3, 4 and 5, wherein the third electrode and the second semiconductor layer make ohmic contact at the interface between them.

11. The vertical organic transistor according to one of claims 2, 3, 4 and 5, wherein the substrate, the first electrode, and the first semiconductor layer are transparent with respect to the visible light.

12. The vertical organic transistor according to claim 2, wherein the inorganic semiconductor material is an electrically conductive metal oxide.

13. The vertical organic transistor according to claim 2, wherein the inorganic semiconductor material is a semiconductive metal oxide.

14. The vertical organic transistor according to claim 3, further comprising a charge transport layer positioned on the second semiconductor layer.

15. The vertical organic transistor according to claim 12, wherein the electrically conductive metal oxide includes:

(1) at least one of first-type metal oxides selected from the group consisting of tin oxide, titanium oxide, germanium oxide, copper oxide, silver oxide, indium oxide, tantalum oxide, barium titanate, strontium titanate, lanthanum chromate, tungsten oxide, europium oxide, aluminum oxide, and lead chromate, each of which exhibits high conductivity because of an oxygen hole or an interstitial metal produced due to a composition offset from the stoichiometric ratio;

(2) at least one of second-type metal oxides selected from the group consisting of rhenium oxide, titanium oxide, lanthanum titanate, lanthanum nickelate, copper lanthanum oxide, copper ruthenium oxide, iridium strontium oxide, strontium chromate, lithium titanate, iridium oxide, and molybdenum oxide, each of which exhibits highest conductivity at the stoichiometric ratio;

(3) at least one of electrically conductive metal oxides selected from the group consisting of vanadium oxide, chromium oxide, calcium iron oxide, iron strontium oxide, cobalt strontium oxide, strontium vanadium oxide, ruthenium strontium oxide, cobalt lanthanum oxide, and nickel oxide; and (4) at least one of electrically conductive metal oxide bronze selected from the group consisting of a tungsten bronze ($M_xWO_3$), a molybdenum bronze ($M_xMoO_3$), and a rhenium bronze ($M_xReO_3$), which has a hydrogen atom, an alkali metal atom, an alkali-earth metal atom, or a rare-earth atom at an empty A-atom position (i.e., at the center of unit lattice) of the perovskite structure of tungsten oxide, molybdenum oxide, and rhenium oxide.

16. The vertical organic transistor according to claim 13, wherein the semi-conductive metal oxide includes (a) an n-type semiconductor material selected from the group consisting of zinc oxide, titanium oxide, tin oxide, indium oxide, aluminum oxide, niobium oxide, tantalum pentoxide, barium titanate, and strontium titanate, (b) a p-type semiconductor material selected from the group consisting of nickel oxide, cobalt oxide, iron oxide, manganese oxide, chromium oxide, and bismuth oxide, and (c) an n-type or p-type semiconductor material obtained by doping impurities into one of said n-type semiconductor material and said p-type semiconductor material.

17. The vertical organic transistor according to claim 14, wherein the charge transport layer is made of a charge transport material, which includes:

(1) at least one kind of low-molecular compound selected from the group consisting of triphenylamine derivatives (TPD), triarylamine compounds, low-molecular weight arylamine derivatives (α-NPD), 2,2',7,7'-tetrakis(diphenylamino)-9,9'-spirobifluorene (Spiro-TAD), N,N'-di( 1-naphthyl)-N,N'-diphenyl-4,4'-diamonobiphenyl (Spiro-NPB), 4,4',4"-tris[N-3-methylphenyl-N-phenylamino]-triphenylamine (mMTDATA), and derivatives thereof; and (2) at least one kind of polymer compound selected from the group consisting of poly(ethylenedioxythiophene) (PEDOT), poly(styrenesulfonic acid) (PSS), poly(aniline) (PANI), and modifications thereof.

18. The vertical organic transistor according to one of claims 2, 3, 4 and 5, wherein the first electrode, the second electrode, and the third electrode are made of at least one of chromium (Cr), tantalum (Ta), titanium (Ti), copper (Cu), aluminum (Al), molybdenum (Mo), tungsten (W), nickel (Ni), gold (Au), palladium (Pd), platinum (Pt), silver (Ag), tin (Sn), oxides thereof, indium tin oxide (ITO), electrically conductive poly(aniline), electrically conductive poly(pyrrole), electrically conductive poly(thiazyl), and electrically conductive polymer.

19. The vertical organic transistor according to one of claims 2, 3, 4 and 5, wherein the second electrode is a gate electrode with a thickness at or below 100 nm.

20. The vertical organic transistor according to one of claims 2, 3, 4 and 5, wherein the first and third electrodes are source and drain electrodes, each having a thickness of 100 nm to 500 nm.

21. The vertical organic transistor according to claim 3, wherein one of the first and second conductivity types is n-type, and the other is p-type.

22. The vertical organic transistor according to claim 4, wherein one of the first and second conductivity types is n-type, and the other is p-type.

23. The vertical organic transistor according to claim 5, wherein one of the first and second conductivity types is n-type, and the other is p-type.

* * * * *